(12) United States Patent
Ponoth et al.

(10) Patent No.: US 9,660,030 B2
(45) Date of Patent: May 23, 2017

(54) REPLACEMENT GATE ELECTRODE WITH A SELF-ALIGNED DIELECTRIC SPACER

(71) Applicant: GLOBALFOUNDRIES INC., Grand Cayman (KY)

(72) Inventors: Shom Ponoth, Gaithersburg, MD (US); Marc A. Bergendahl, Hopewell Junction, NY (US); Steven J. Holmes, Guilderland, NY (US); David V. Horak, Essex Junction, VT (US); Charles W. Koburger, III, Delmar, NY (US); Chih-Chao Yang, Glenmont, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 308 days.

(21) Appl. No.: 14/473,033

(22) Filed: Aug. 29, 2014

(65) Prior Publication Data
US 2014/0363941 A1   Dec. 11, 2014

Related U.S. Application Data

(62) Division of application No. 13/845,394, filed on Mar. 18, 2013, now abandoned.

(51) Int. Cl.
*H01L 29/165* (2006.01)
*H01L 21/338* (2006.01)
(Continued)

(52) U.S. Cl.
CPC ...... *H01L 29/0847* (2013.01); *H01L 21/0257* (2013.01); *H01L 21/02636* (2013.01);
(Continued)

(58) Field of Classification Search
CPC ... H01L 29/6647; H01L 29/78; H01L 27/088; H01L 29/1079; H01L 29/0847;
(Continued)

(56) References Cited

U.S. PATENT DOCUMENTS 6,124,627 A   9/2000  Rodder et al.
6,258,678 B1  7/2001  Liaw
(Continued)

OTHER PUBLICATIONS

Office Action dated Sep. 8, 2015 received in related U.S. Patent Application, namely U.S. Appl. No. 13/845,394.
(Continued)

*Primary Examiner* — Thomas L Dickey
*Assistant Examiner* — Damon Hillman
(74) *Attorney, Agent, or Firm* — Scully, Scott, Murphy & Presser, P.C.

(57) ABSTRACT

A dielectric disposable gate structure can be formed across a semiconductor material portion, and active semiconductor regions are formed within the semiconductor material portion. Raised active semiconductor regions are grown over the active semiconductor regions while the dielectric disposable gate structure limits the extent of the raised active semiconductor regions. A planarization dielectric layer is formed over the raised active semiconductor regions. In one embodiment, the dielectric disposable gate structure is removed, and a dielectric gate spacer can be formed by conversion of surface portions of the raised active semiconductor regions around a gate cavity. Alternately, an etch mask layer overlying peripheral portions of the disposable gate structure can be formed, and a gate cavity and a dielectric spacer can be formed by anisotropically etching an unmasked portion of the dielectric disposable gate structure. A replacement gate structure can be formed in the gate cavity.

19 Claims, 21 Drawing Sheets

(51) Int. Cl.
  *H01L 29/08*  (2006.01)
  *H01L 29/66*  (2006.01)
  *H01L 21/28*  (2006.01)
  *H01L 21/02*  (2006.01)
  *H01L 29/78*  (2006.01)

(52) U.S. Cl.
  CPC .. *H01L 21/28008* (2013.01); *H01L 21/28114* (2013.01); *H01L 29/66545* (2013.01); *H01L 29/66553* (2013.01); *H01L 29/66795* (2013.01); *H01L 29/785* (2013.01)

(58) Field of Classification Search
  CPC ............. H01L 29/778; H01L 29/66477; H01L 27/0928; H01L 29/775; H01L 29/0653
  See application file for complete search history.

(56) References Cited

U.S. PATENT DOCUMENTS

| | | | |
|---|---|---|---|
| 7,247,569 B2 | 7/2007 | Boyd et al. | |
| 7,838,913 B2* | 11/2010 | Cheng | H01L 21/82341 257/263 |
| 8,053,849 B2 | 11/2011 | Pan et al. | |
| 8,603,881 B1 | 12/2013 | Alptekin et al. | |
| 8,847,281 B2* | 9/2014 | Cea | H01L 29/66545 257/192 |
| 2004/0217420 A1 | 11/2004 | Yeo et al. | |
| 2005/0156248 A1 | 7/2005 | Chen et al. | |
| 2007/0252211 A1 | 11/2007 | Yagishita | |
| 2009/0061572 A1 | 3/2009 | Hareland et al. | |
| 2012/0235234 A1 | 9/2012 | Chang et al. | |
| 2013/0015510 A1 | 1/2013 | Yan et al. | |
| 2014/0027816 A1* | 1/2014 | Cea | H01L 29/66545 257/192 |

OTHER PUBLICATIONS

Office Action dated Dec. 15, 2014 received in U.S. Appl. No. 13/845,394.
Office Action dated Apr. 9, 2015 received in U.S. Appl. No. 13/845,394.
Sekine et al., "Highly Reliable Ultrathin Silicon Oxide Film Formation at Low Temperature by Oxygen Radical Generated in High-Density Krypton Plasma", IEEE Transactions on Electron Devices, vol. 48, No. 8, Aug. 2001, pp. 1550-1555.

* cited by examiner

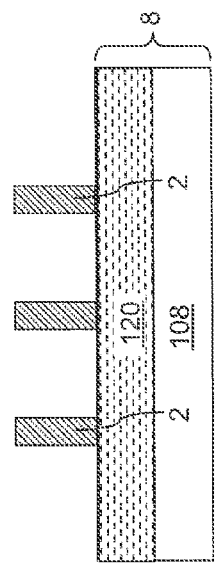
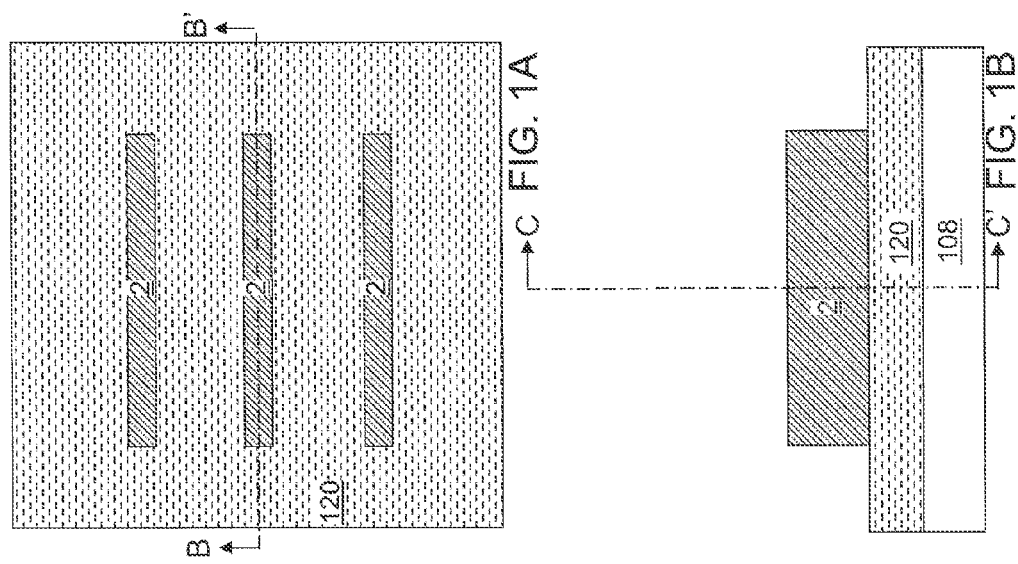
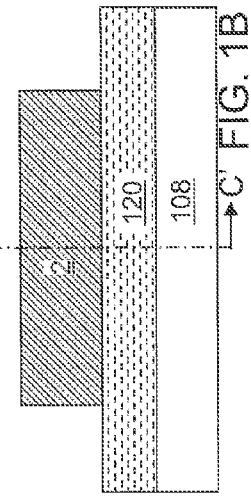

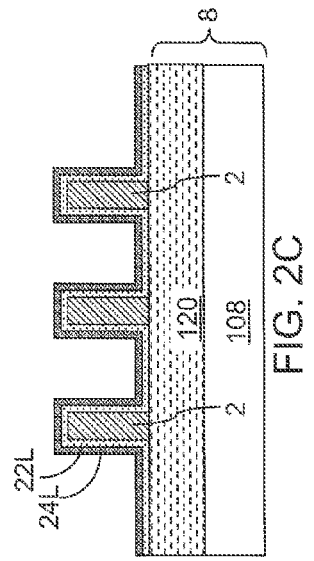
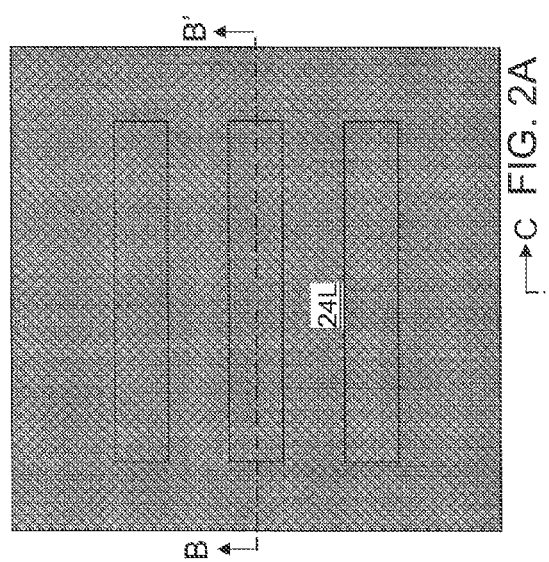
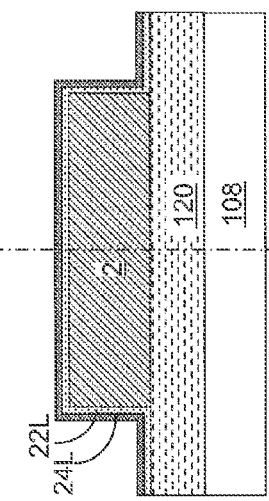
FIG. 2A
FIG. 2B
FIG. 2C

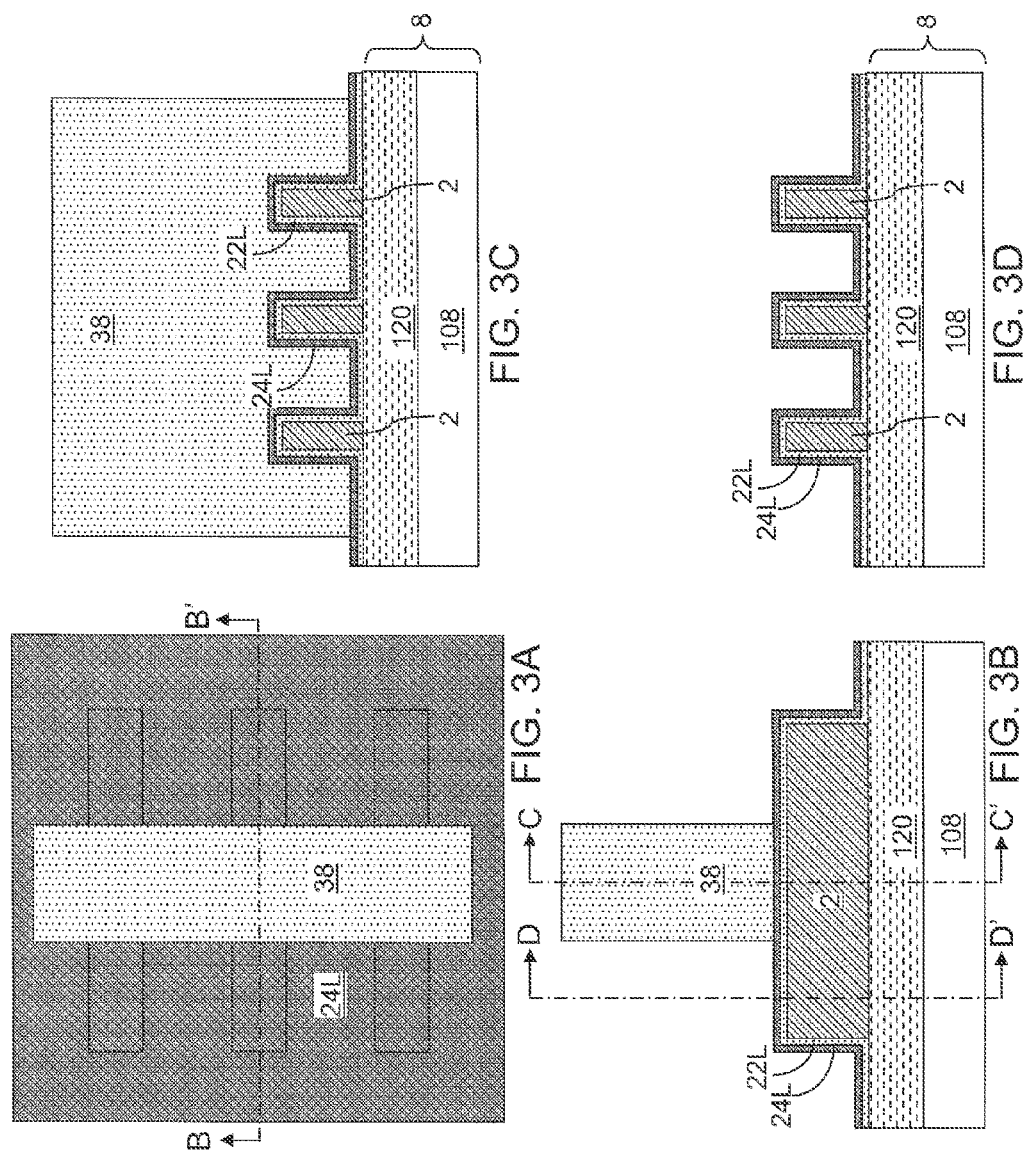

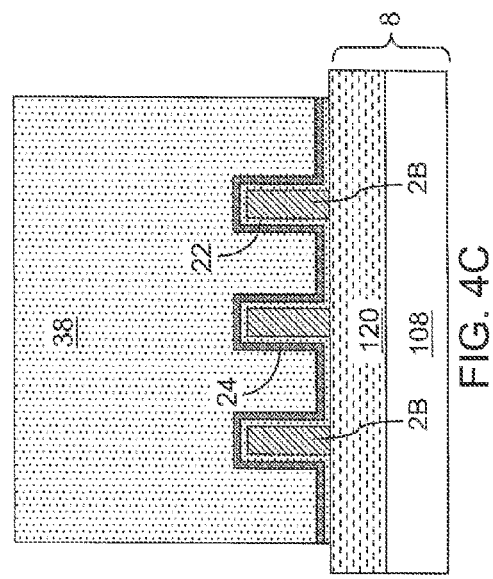
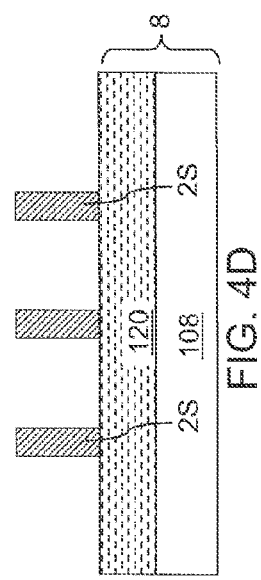
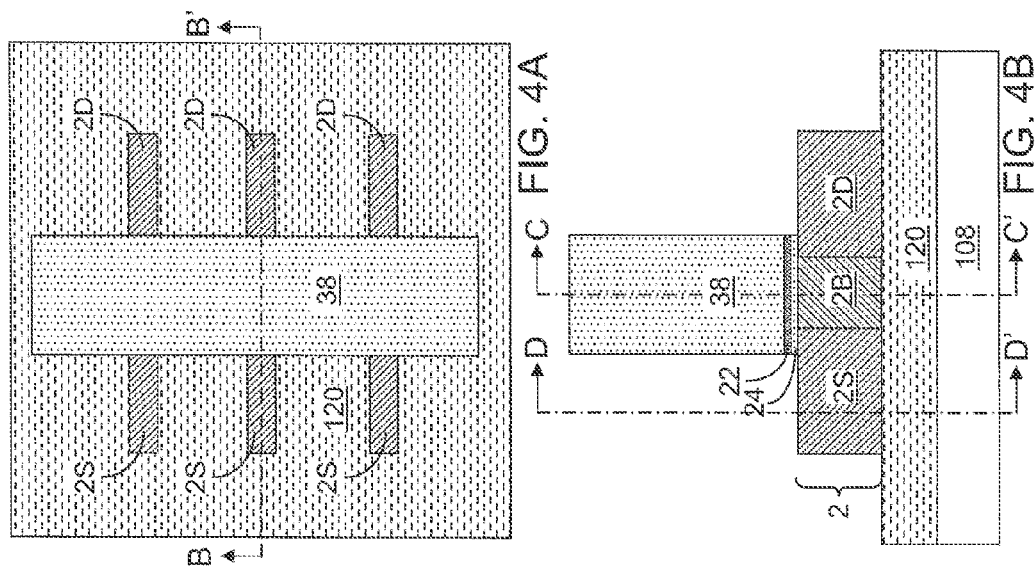

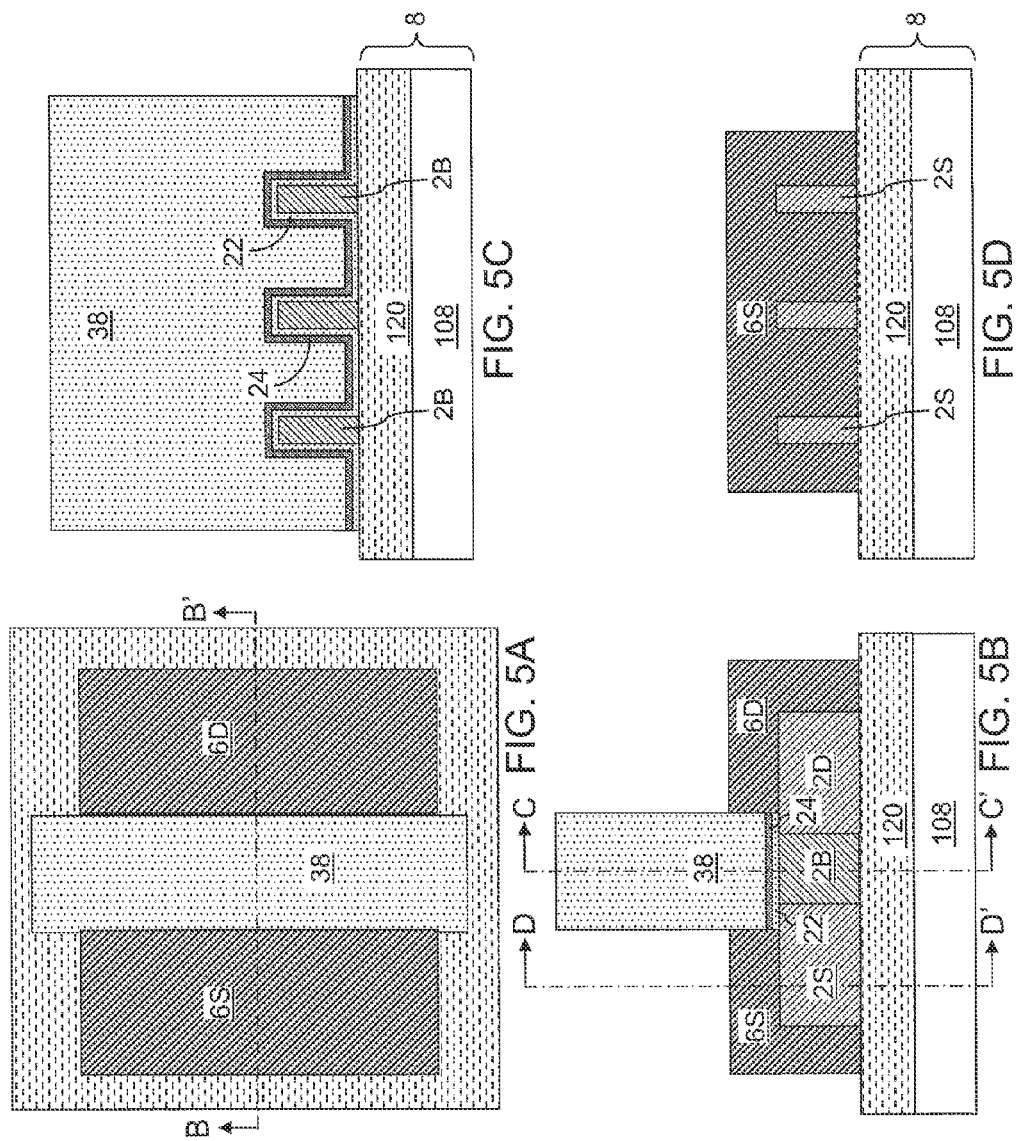

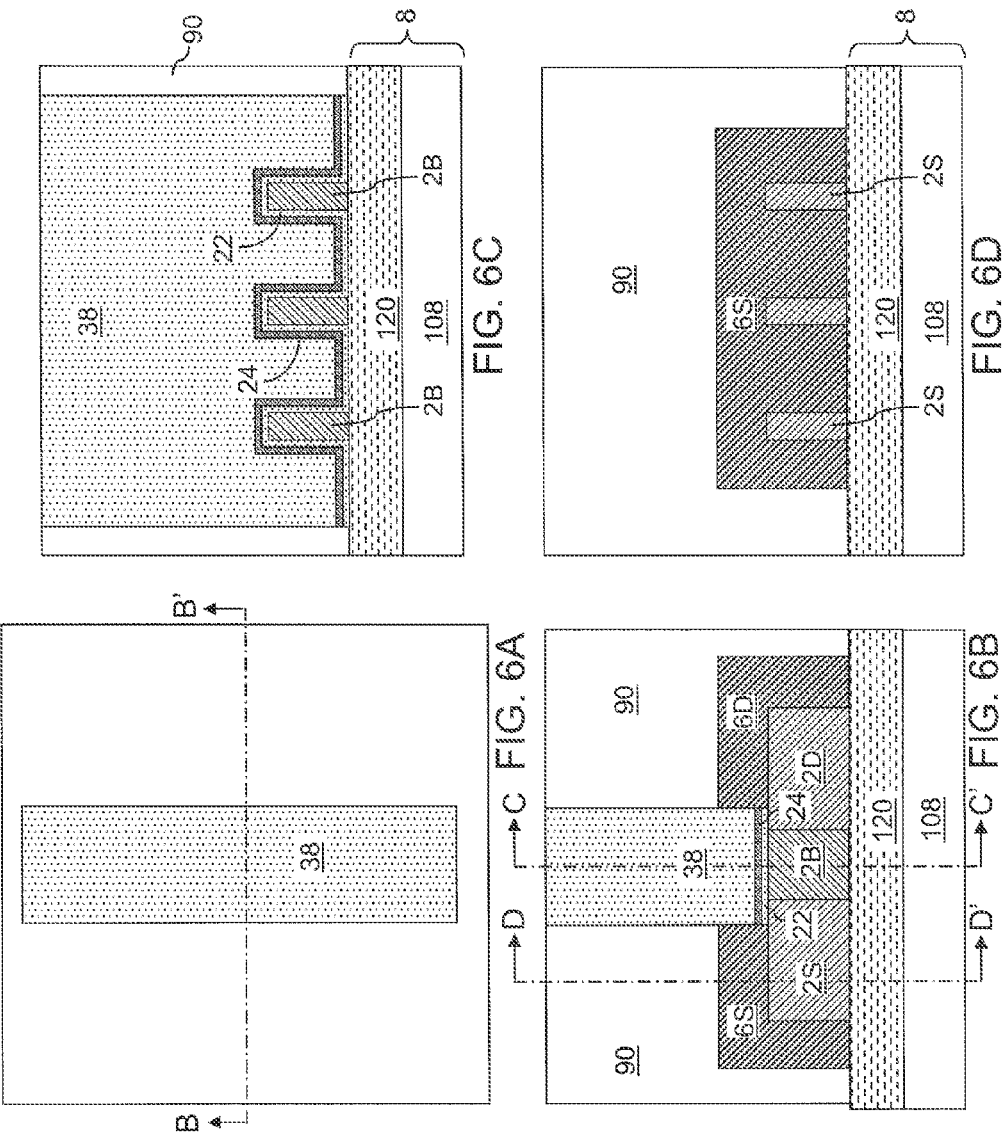

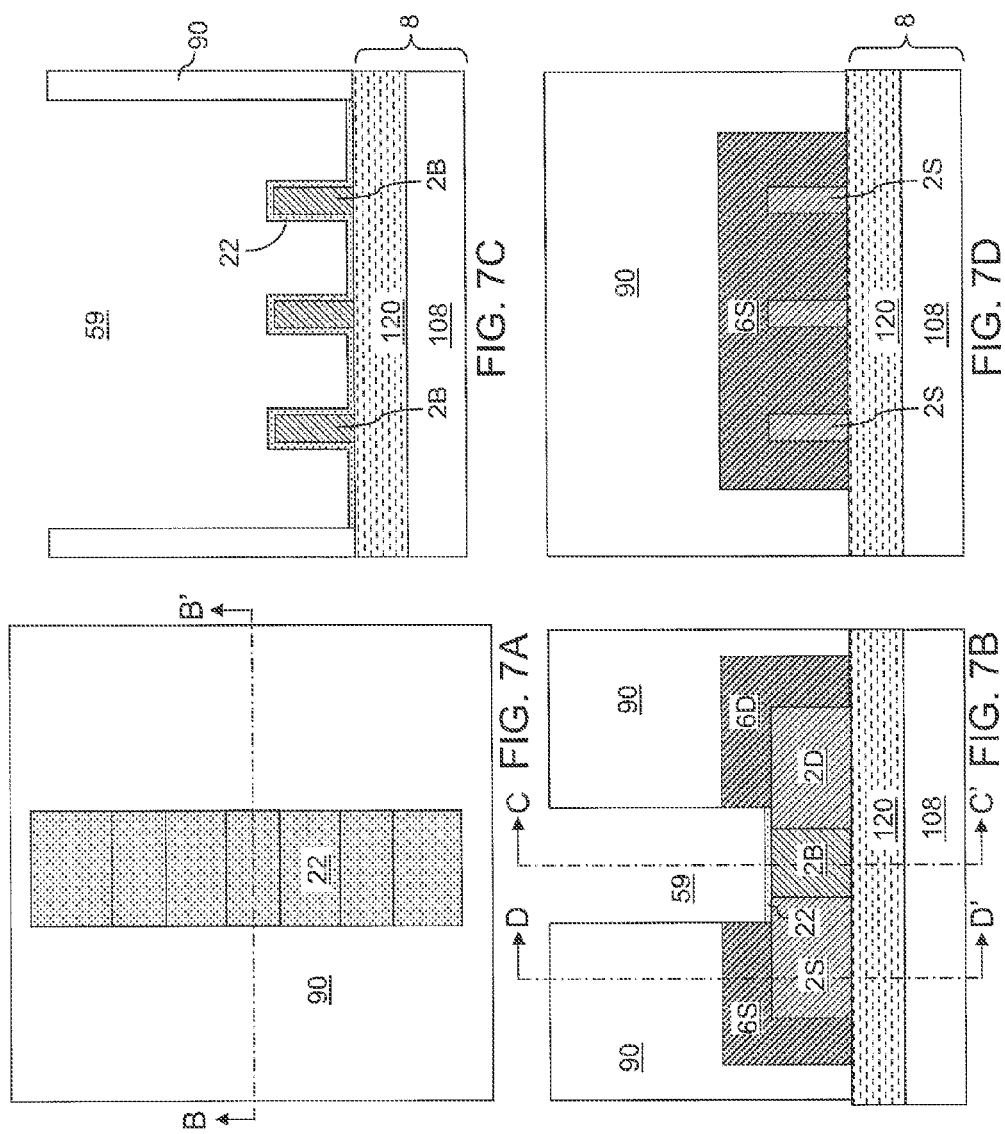

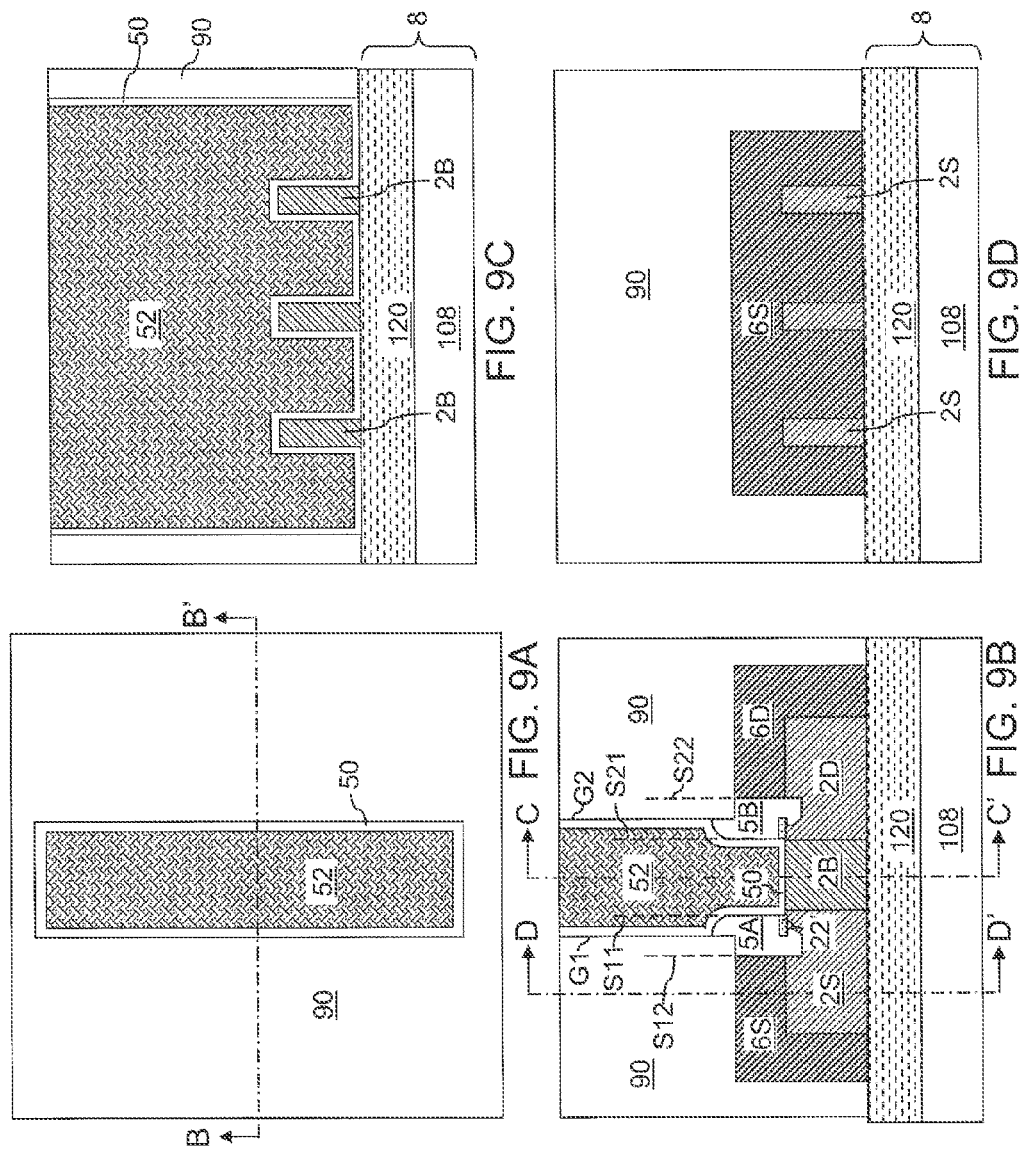

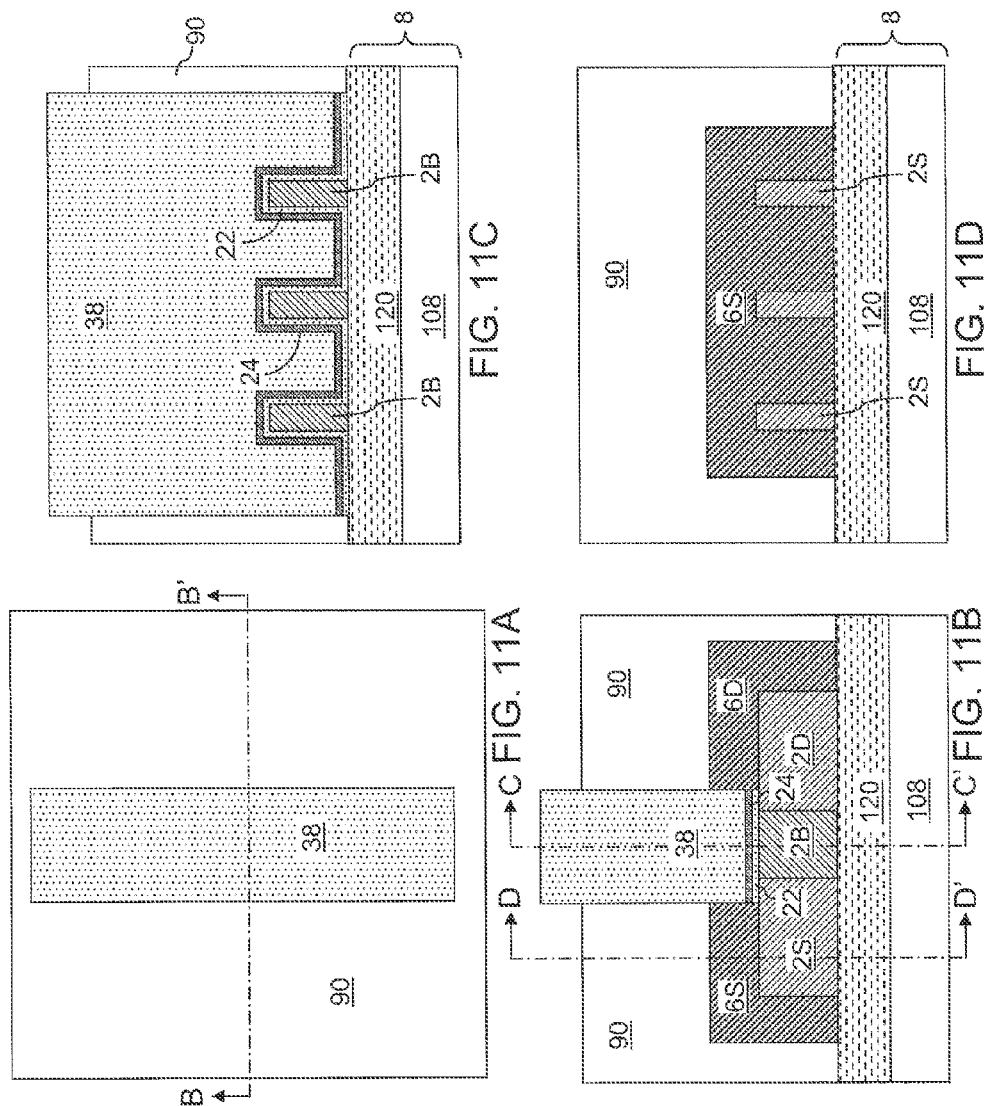

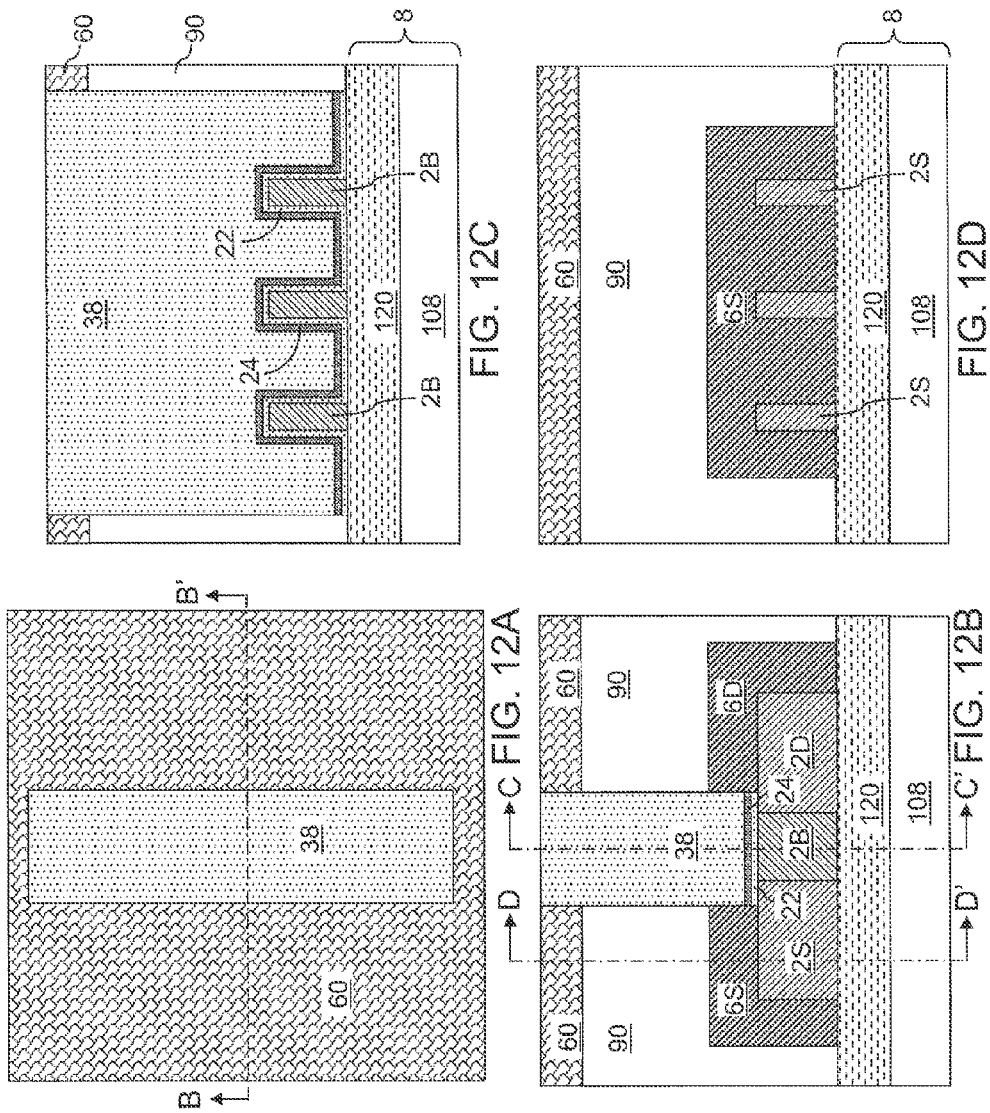

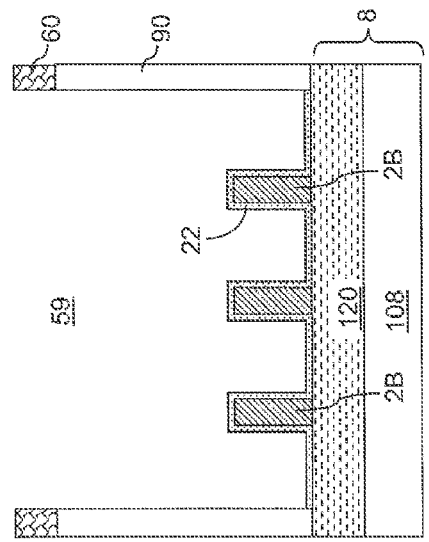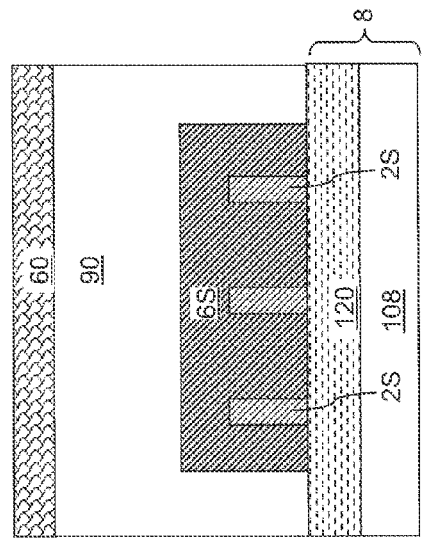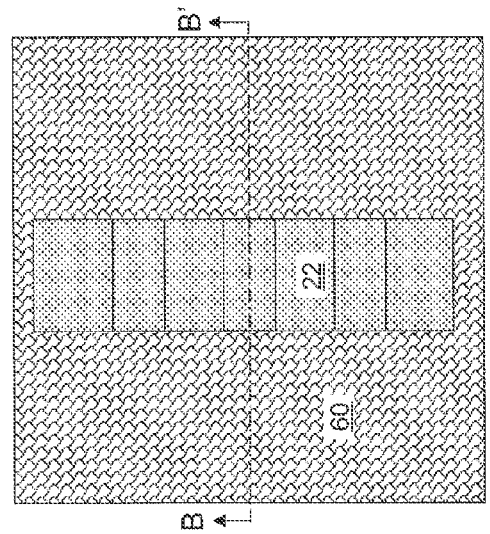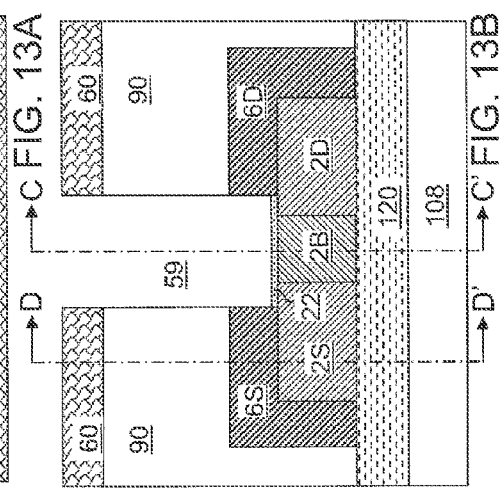

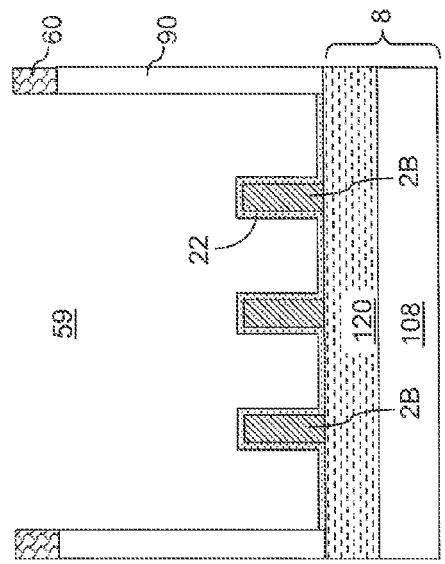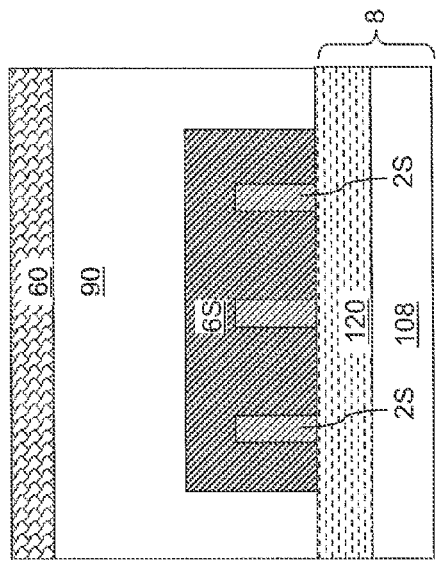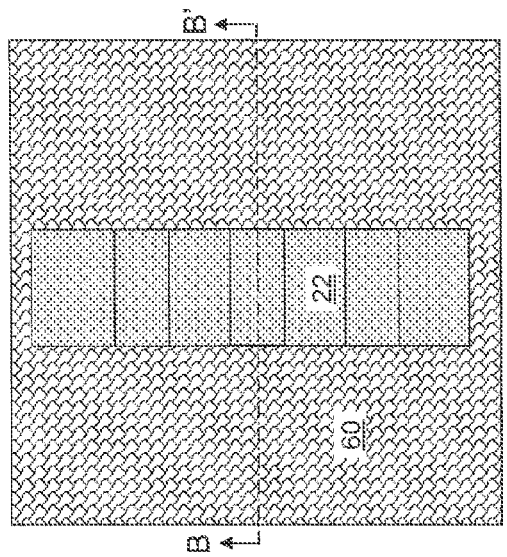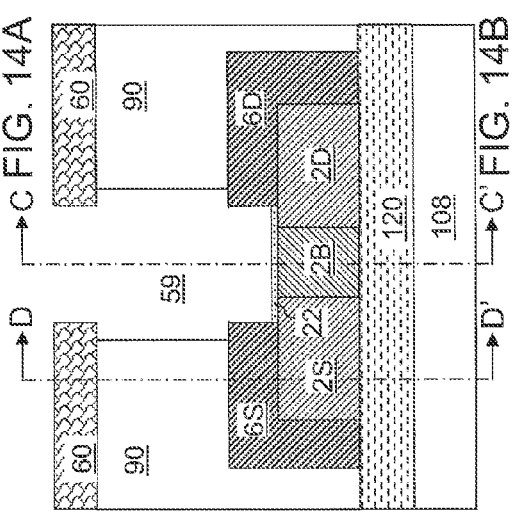

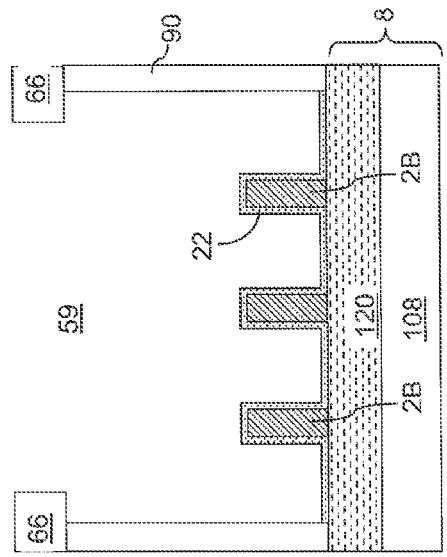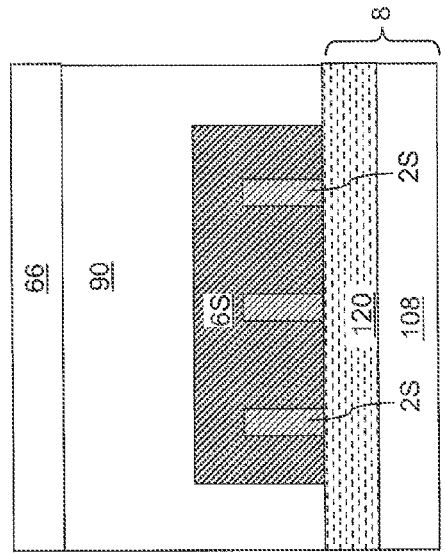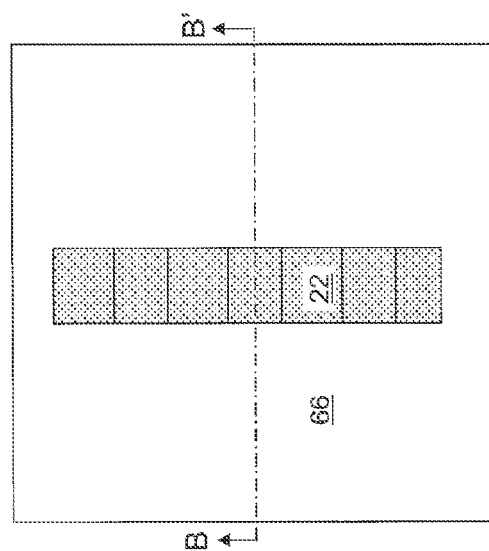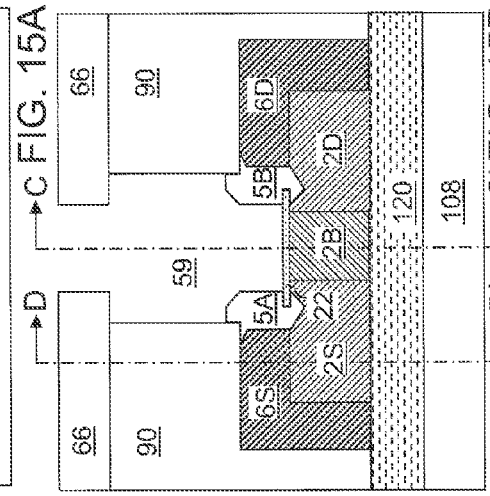

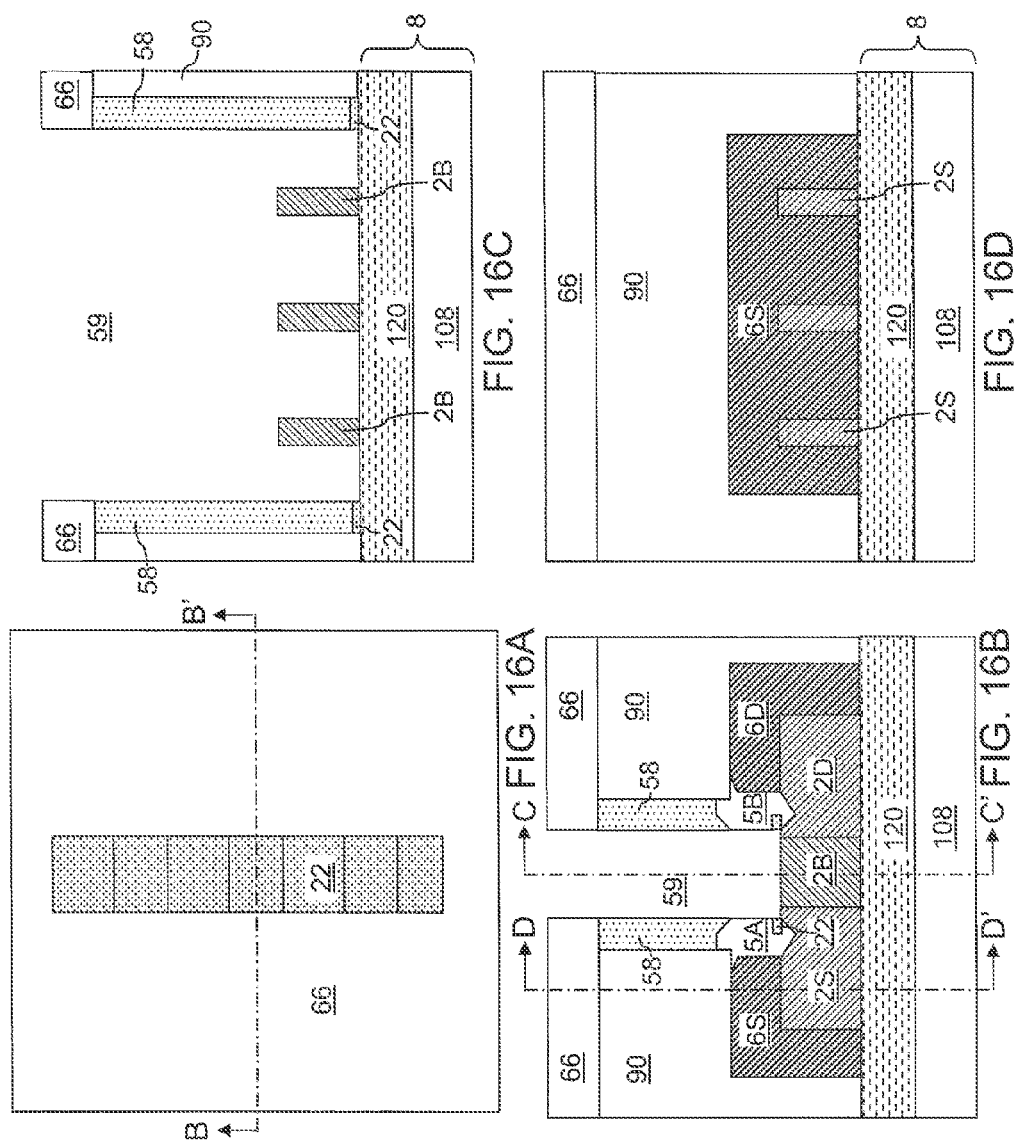

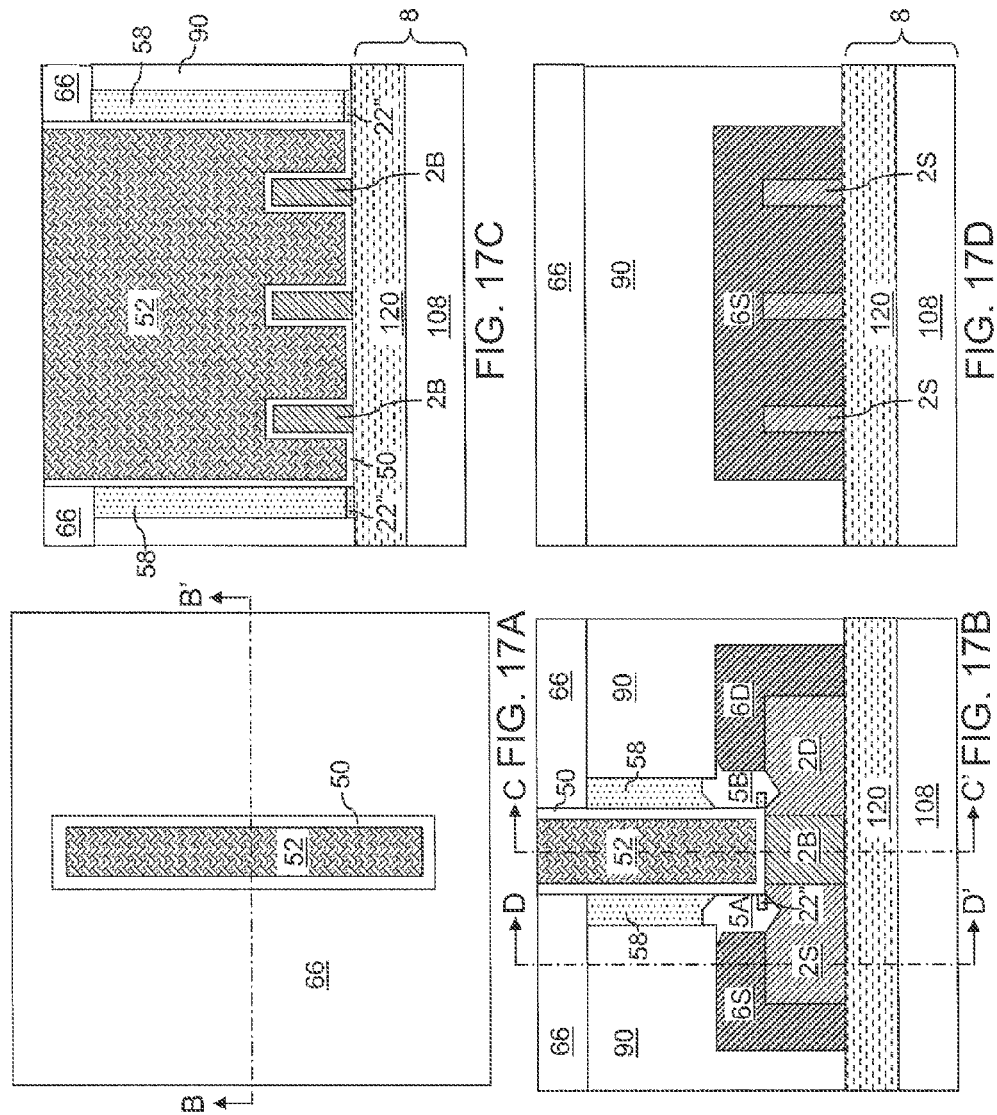

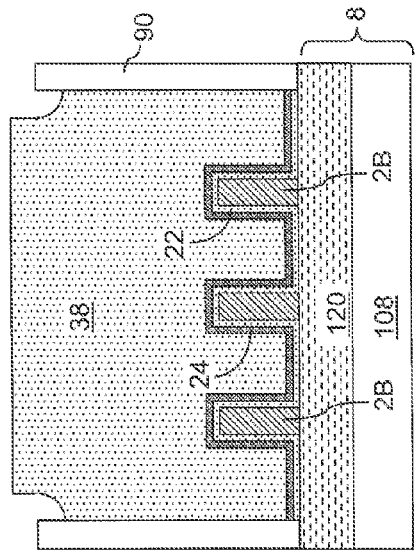
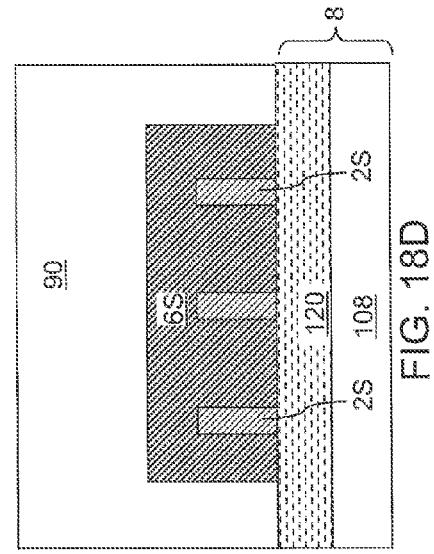
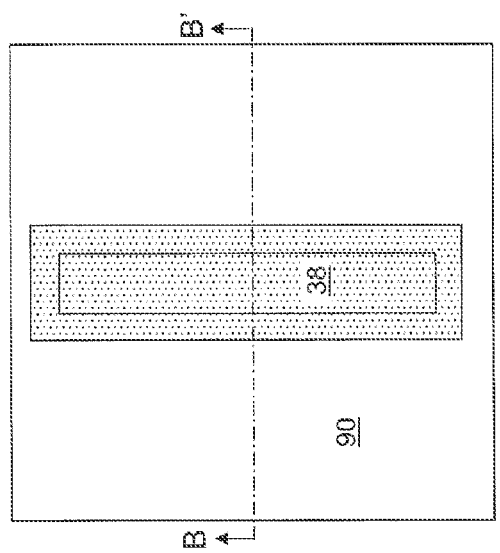
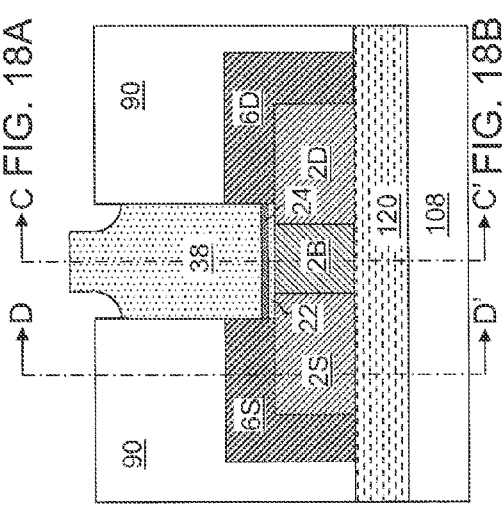

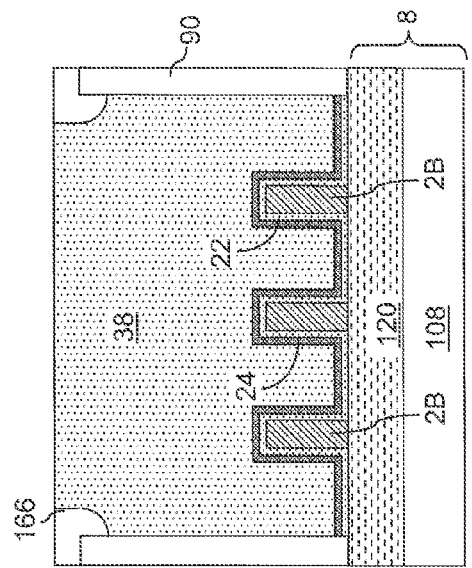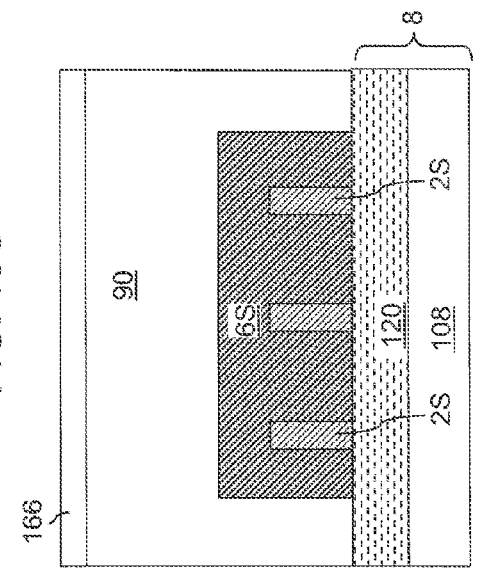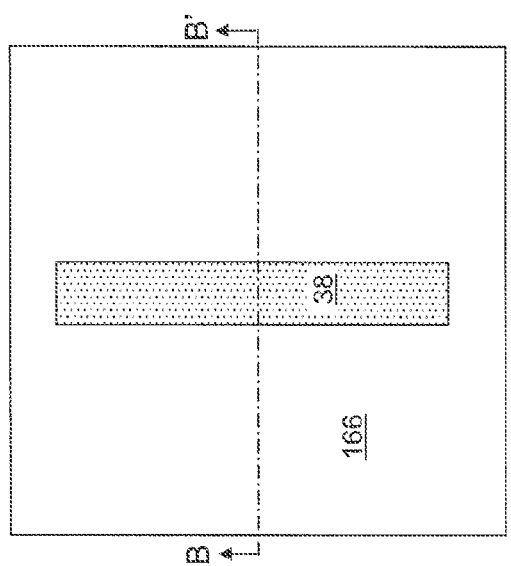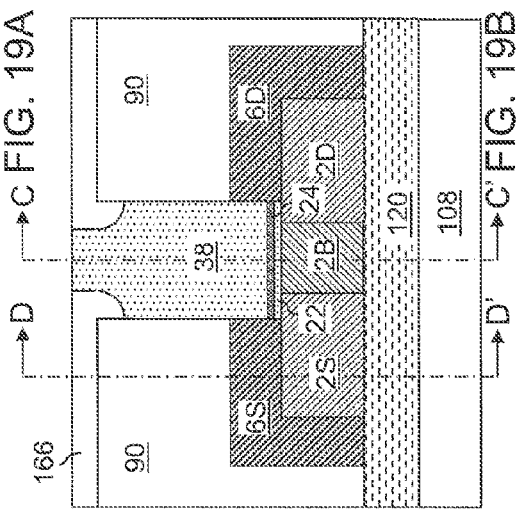

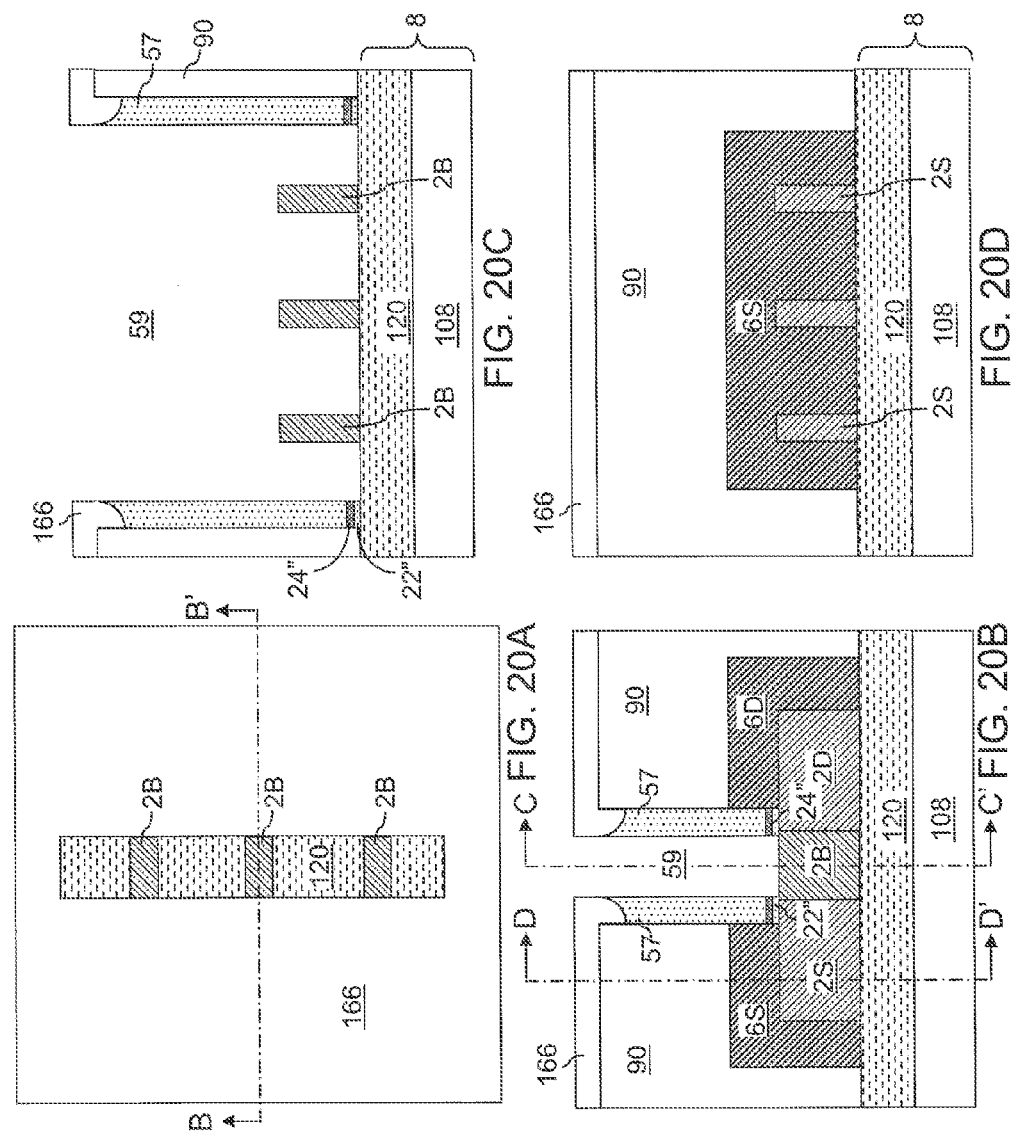

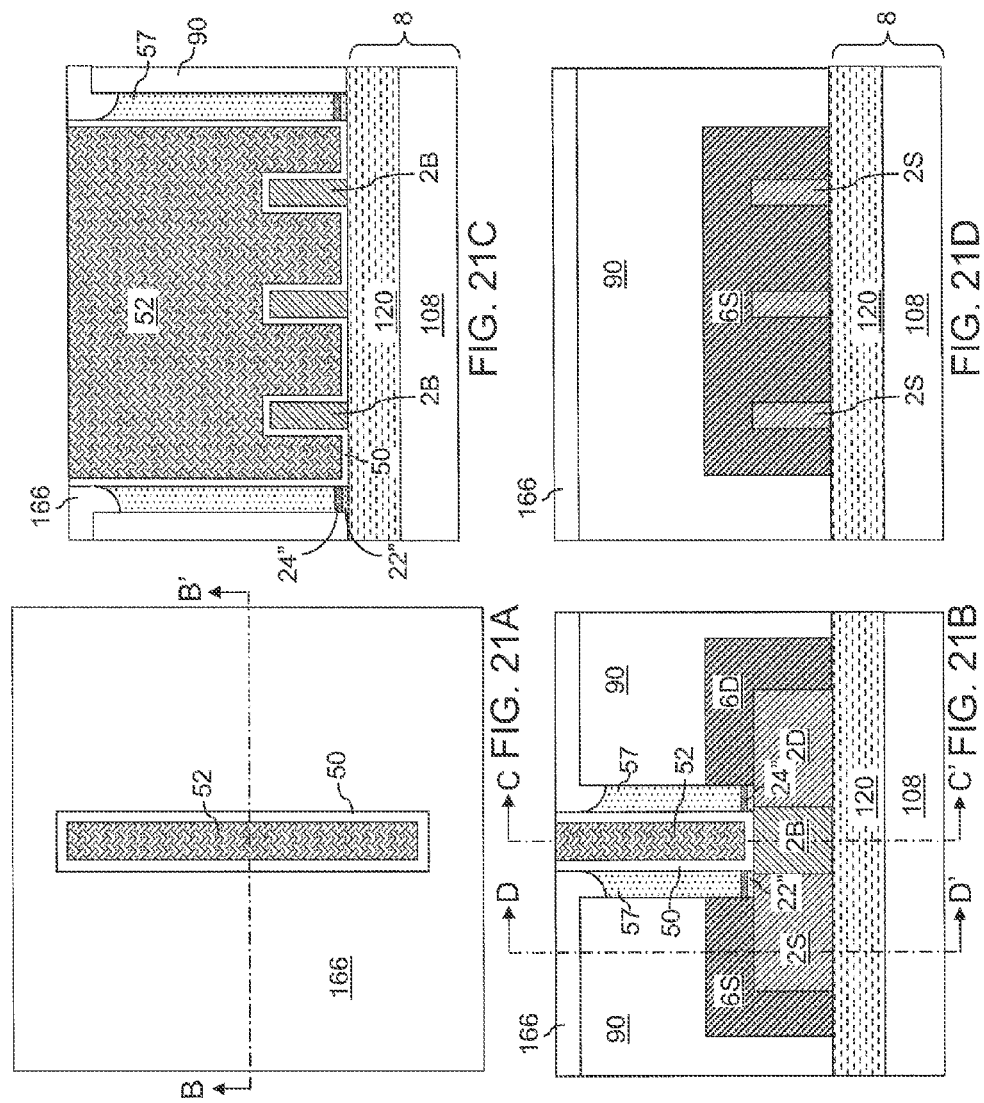

REPLACEMENT GATE ELECTRODE WITH A SELF-ALIGNED DIELECTRIC SPACER

BACKGROUND

The present disclosure generally relates to semiconductor devices, and particularly to field effect transistors employing a replacement gate electrode and a self-aligned dielectric spacer and methods for manufacturing the same.

In a replacement gate integration scheme, a dielectric gate spacer for a field effect transistor is subjected to an etch process during removal of a disposable gate structure. The etch process causes collateral damages to the dielectric gate spacer, which introduces variations in the dimensions in the replacement gate structure that is subsequently formed in a gate cavity. Control of the collateral etch of the dielectric gate spacer during removal of the disposable gate structure to form the gate cavity is difficult because the disposable gate structure typically has a high aspect ratio. Thus, a method for alleviating the difficulties caused by the collateral etch of the dielectric spacer is desired.

BRIEF SUMMARY

A dielectric disposable gate structure can be formed across a semiconductor material portion, and active semiconductor regions are formed within the semiconductor material portion. Raised active semiconductor regions are grown over the active semiconductor regions while the dielectric disposable gate structure limits the extent of the raised active semiconductor regions. A planarization dielectric layer is formed over the raised active semiconductor regions. In one embodiment, the dielectric disposable gate structure is removed, and a dielectric gate spacer can be formed by conversion of surface portions of the raised active semiconductor regions around a gate cavity. Alternately, an etch mask layer overlying peripheral portions of the disposable gate structure can be formed, and a gate cavity and a dielectric spacer can be formed by anisotropically etching an unmasked portion of the dielectric disposable gate structure. A replacement gate structure can be formed in the gate cavity.

According to an aspect of the present disclosure, a semiconductor includes a semiconductor material portion, which contains a body region, a source region, and a drain region. The semiconductor structure further includes a gate stack, which contains a gate dielectric and a gate electrode. The gate stack straddles the body region. A first dielectric spacer contacts a first vertical sidewall of said gate dielectric. A second dielectric spacer contacts a second vertical sidewall of the gate dielectric, and is laterally spaced from the first dielectric spacer by the gate stack.

According to another aspect of the present disclosure, a semiconductor structure includes a semiconductor material portion, which includes a body region, a source region, and a drain region. A gate stack includes a gate dielectric and a gate electrode. The gate stack straddles the body region. A dielectric spacer laterally surrounds the gate stack. All sidewalls of the dielectric spacer are within vertical planes.

According to yet another aspect of the present disclosure, a method of forming a semiconductor structure is provided. A disposable dielectric gate structure is formed over a semiconductor material portion. A source region, a drain region, and a body region are formed in the semiconductor material portion. A raised source region and a raised drain region are formed on the source region and the drain region, respectively. The raised source region and the raised drain region contact sidewalls of the disposable dielectric gate structure. A planarization dielectric layer is formed over the raised source region and the raised drain region and around the disposable dielectric gate structure. The disposable dielectric gate structure is removed selective to the planarization dielectric layer to form a gate cavity. Surface portions of the raised source region and the raised drain region are converted into a first dielectric spacer and a second dielectric spacer.

According to still another aspect of the present disclosure, a method of forming a semiconductor structure is provided. A dielectric gate structure is formed over a semiconductor material portion. A source region, a drain region, and a body region are formed in the semiconductor material portion. A raised source region and a raised drain region are formed on the source region and the drain region, respectively. The raised source region and the raised drain region contact sidewalls of the dielectric gate structure. A planarization dielectric layer is formed over the raised source region and the raised drain region and around the dielectric gate structure. A dielectric material layer having an opening therein is formed over the planarization dielectric layer. A periphery of the opening is within an area defined by sidewalls of the dielectric gate structures. A dielectric spacer and a gate cavity are formed by anisotropically etching the dielectric gate structure employing the dielectric material layer as an etch mask. A remaining contiguous portion of the dielectric gate structure constitutes the dielectric spacer.

BRIEF DESCRIPTION OF THE DRAWINGS

FIG. 1A is a top-down view of a first exemplary semiconductor structure after formation of semiconductor fins according to a first embodiment of the present disclosure.

FIG. 1B is a vertical cross-sectional view of the first exemplary semiconductor structure along the plane B-B' of FIG. 1A.

FIG. 1C is a vertical cross-sectional view of the first exemplary semiconductor structure along the plane C-C' of FIG. 1B.

FIG. 2A is a top-down view of the first exemplary semiconductor structure after formation of a diffusion-resistant dielectric material liner and an etch stop layer according to the first embodiment of the present disclosure.

FIG. 2B is a vertical cross-sectional view of the first exemplary semiconductor structure along the plane B-B' of FIG. 2A.

FIG. 2C is a vertical cross-sectional view of the first exemplary semiconductor structure along the plane C-C' of FIG. 2B.

FIG. 3A is a top-down view of the first exemplary semiconductor structure after formation of a dielectric gate structure according to the first embodiment of the present disclosure.

FIG. 3B is a vertical cross-sectional view of the first exemplary semiconductor structure along the plane B-B' of FIG. 3A.

FIG. 3C is a vertical cross-sectional view of the first exemplary semiconductor structure along the plane C-C' of FIG. 3B.

FIG. 3D is a vertical cross-sectional view of the first exemplary semiconductor structure along the plane D-D' of FIG. 3B.

FIG. 4A is a top-down view of the first exemplary semiconductor structure after formation of source regions, drain regions, and body regions according to the first embodiment of the present disclosure.

FIG. 4B is a vertical cross-sectional view of the first exemplary semiconductor structure along the plane B-B' of FIG. 4A.

FIG. 4C is a vertical cross-sectional view of the first exemplary semiconductor structure along the plane C-C' of FIG. 4B.

FIG. 4D is a vertical cross-sectional view of the first exemplary semiconductor structure along the plane D-D' of FIG. 4B.

FIG. 5A is a top-down view of the first exemplary semiconductor structure after formation of a raised source region and a raised drain region according to the first embodiment of the present disclosure.

FIG. 5B is a vertical cross-sectional view of the first exemplary semiconductor structure along the plane B-B' of FIG. 5A.

FIG. 5C is a vertical cross-sectional view of the first exemplary semiconductor structure along the plane C-C' of FIG. 5B.

FIG. 5D is a vertical cross-sectional view of the first exemplary semiconductor structure along the plane D-D' of FIG. 5B.

FIG. 6A is a top-down view of the first exemplary semiconductor structure after deposition and planarization of a planarization dielectric layer according to the first embodiment of the present disclosure.

FIG. 6B is a vertical cross-sectional view of the first exemplary semiconductor structure along the plane B-B' of FIG. 6A.

FIG. 6C is a vertical cross-sectional view of the first exemplary semiconductor structure along the plane C-C' of FIG. 6B.

FIG. 6D is a vertical cross-sectional view of the first exemplary semiconductor structure along the plane D-D' of FIG. 6B.

FIG. 7A is a top-down view of the first exemplary semiconductor structure after removal of the dielectric gate structure according to the first embodiment of the present disclosure.

FIG. 7B is a vertical cross-sectional view of the first exemplary semiconductor structure along the plane B-B' of FIG. 7A.

FIG. 7C is a vertical cross-sectional view of the first exemplary semiconductor structure along the plane C-C' of FIG. 7B.

FIG. 7D is a vertical cross-sectional view of the first exemplary semiconductor structure along the plane D-D' of FIG. 7B.

FIG. 9A is a top-down view of the first exemplary semiconductor structure after formation of a replacement gate structure according to the first embodiment of the present disclosure.

FIG. 9B is a vertical cross-sectional view of the first exemplary semiconductor structure along the plane B-B' of FIG. 9A.

FIG. 9C is a vertical cross-sectional view of the first exemplary semiconductor structure along the plane C-C' of FIG. 9B.

FIG. 9D is a vertical cross-sectional view of the first exemplary semiconductor structure along the plane D-D' of FIG. 9B.

FIG. 11A is a top-down view of a second exemplary semiconductor structure after recessing of the planarization dielectric layer according to a second embodiment of the present disclosure.

FIG. 11B is a vertical cross-sectional view of the second exemplary semiconductor structure along the plane B-B' of FIG. 11A.

FIG. 11C is a vertical cross-sectional view of the second exemplary semiconductor structure along the plane C-C' of FIG. 11B.

FIG. 11D is a vertical cross-sectional view of the second exemplary semiconductor structure along the plane D-D' of FIG. 11B.

FIG. 12A is a top-down view of the second exemplary semiconductor structure after formation of a semiconductor material layer according to the second embodiment of the present disclosure.

FIG. 12B is a vertical cross-sectional view of the second exemplary semiconductor structure along the plane B-B' of FIG. 12A.

FIG. 12C is a vertical cross-sectional view of the second exemplary semiconductor structure along the plane C-C' of FIG. 12B.

FIG. 12D is a vertical cross-sectional view of the second exemplary semiconductor structure along the plane D-D' of FIG. 12B.

FIG. 13A is a top-down view of the second exemplary semiconductor structure after removal of the dielectric gate structure according to the second embodiment of the present disclosure.

FIG. 13B is a vertical cross-sectional view of the second exemplary semiconductor structure along the plane B-B' of FIG. 13A.

FIG. 13C is a vertical cross-sectional view of the second exemplary semiconductor structure along the plane C-C' of FIG. 13B.

FIG. 13D is a vertical cross-sectional view of the second exemplary semiconductor structure along the plane D-D' of FIG. 13B.

FIG. 14A is a top-down view of the second exemplary semiconductor structure after optional lateral recessing of sidewalls of the planarization dielectric layer according to the second embodiment of the present disclosure.

FIG. 14B is a vertical cross-sectional view of the second exemplary semiconductor structure along the plane B-B' of FIG. 14A.

FIG. 14C is a vertical cross-sectional view of the second exemplary semiconductor structure along the plane C-C' of FIG. 14B.

FIG. 14D is a vertical cross-sectional view of the second exemplary semiconductor structure along the plane D-D' of FIG. 14B.

FIG. 15A is a top-down view of the second exemplary semiconductor structure after conversion of surface portions of the raised source region and the raised drain region into a first dielectric spacer and a second dielectric spacer, respectively, and simultaneous conversion of the semiconductor material layer into a semiconductor-element-including dielectric material layer according to the second embodiment of the present disclosure.

FIG. 15B is a vertical cross-sectional view of the second exemplary semiconductor structure along the plane B-B' of FIG. 15A.

FIG. 15C is a vertical cross-sectional view of the second exemplary semiconductor structure along the plane C-C' of FIG. 15B.

FIG. 15D is a vertical cross-sectional view of the second exemplary semiconductor structure along the plane D-D' of FIG. 15B.

FIG. 16A is a top-down view of the second exemplary semiconductor structure after formation of a contiguous dielectric spacer by deposition of a conformal dielectric material layer and an anisotropic etch according to the second embodiment of the present disclosure.

FIG. 16B is a vertical cross-sectional view of the second exemplary semiconductor structure along the plane B-B' of FIG. 16A.

FIG. 16C is a vertical cross-sectional view of the second exemplary semiconductor structure along the plane C-C' of FIG. 16B.

FIG. 16D is a vertical cross-sectional view of the second exemplary semiconductor structure along the plane D-D' of FIG. 16B.

FIG. 17A is a top-down view of the second exemplary semiconductor structure after formation of a replacement gate structure according to the second embodiment of the present disclosure.

FIG. 17B is a vertical cross-sectional view of the second exemplary semiconductor structure along the plane B-B' of FIG. 17A.

FIG. 17C is a vertical cross-sectional view of the second exemplary semiconductor structure along the plane C-C' of FIG. 17B.

FIG. 17D is a vertical cross-sectional view of the second exemplary semiconductor structure along the plane D-D' of FIG. 17B.

FIG. 18A is a top-down view of a third exemplary semiconductor structure after an isotropic etch of the dielectric gate structure according to a third embodiment of the present disclosure.

FIG. 18B is a vertical cross-sectional view of the third exemplary semiconductor structure along the plane B-B' of FIG. 18A.

FIG. 18C is a vertical cross-sectional view of the third exemplary semiconductor structure along the plane C-C' of FIG. 18B.

FIG. 18D is a vertical cross-sectional view of the third exemplary semiconductor structure along the plane D-D' of FIG. 18B.

FIG. 19A is a top-down view of a third exemplary semiconductor structure after formation of a dielectric material layer over the planarization dielectric layer according to the third embodiment of the present disclosure.

FIG. 19B is a vertical cross-sectional view of the third exemplary semiconductor structure along the plane B-B' of FIG. 19A.

FIG. 19C is a vertical cross-sectional view of the third exemplary semiconductor structure along the plane C-C' of FIG. 19B.

FIG. 19D is a vertical cross-sectional view of the third exemplary semiconductor structure along the plane D-D' of FIG. 19B.

FIG. 20A is a top-down view of a third exemplary semiconductor structure after formation of a dielectric spacer according to the third embodiment of the present disclosure.

FIG. 20B is a vertical cross-sectional view of the third exemplary semiconductor structure along the plane B-B' of FIG. 20A.

FIG. 20C is a vertical cross-sectional view of the third exemplary semiconductor structure along the plane C-C' of FIG. 20B.

FIG. 20D is a vertical cross-sectional view of the third exemplary semiconductor structure along the plane D-D' of FIG. 20B.

FIG. 21A is a top-down view of a third exemplary semiconductor structure after formation of a replacement gate structure according to the third embodiment of the present disclosure.

FIG. 21B is a vertical cross-sectional view of the third exemplary semiconductor structure along the plane B-B' of FIG. 21A.

FIG. 21C is a vertical cross-sectional view of the third exemplary semiconductor structure along the plane C-C' of FIG. 21B.

FIG. 21D is a vertical cross-sectional view of the third exemplary semiconductor structure along the plane D-D' of FIG. 21B.

DETAILED DESCRIPTION

Figure 8A:
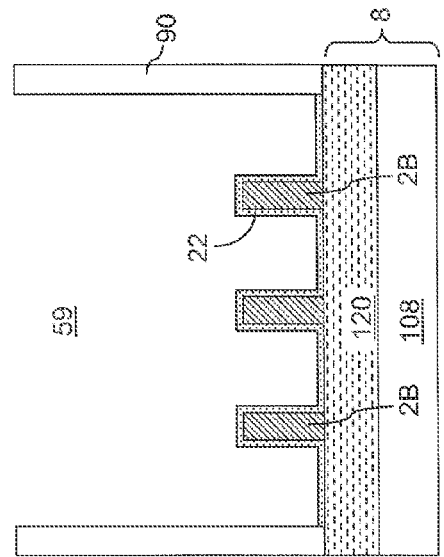
FIG. 8A is a top-down view of the first exemplary semiconductor structure after formation of a first dielectric spacer and a second dielectric spacer according to a second embodiment of the present disclosure.

As stated above, the present disclosure relates to faceted semiconductor nanowires and semiconductor structures employing the same, and methods of manufacturing the same. Aspects of the present disclosure are now described in detail with accompanying figures. It is noted that like reference numerals refer to like elements across different embodiments. The drawings are not necessarily drawn to scale. The drawings are not necessarily drawn to scale. As used herein, ordinals are employed to distinguish similar elements, and a same element may be labeled with different ordinals across the specification and the claims.

Referring to FIGS. 1A-1C, a first exemplary semiconductor according to a first embodiment of the present disclosure includes at least one semiconductor material portion 2 formed on a substrate 8. The substrate 8 can include an insulator layer 120 and a handle substrate 108. The insulator layer 120 includes a dielectric material such as silicon oxide, silicon nitride, silicon oxynitride, or a combination thereof. The handle substrate 108 can include a semiconductor material, a conductive material, a dielectric material, or a combination thereof, and provides mechanical support to the insulator layer 120 and the structures thereupon.

The at least one semiconductor material portion 2 includes a semiconductor material, which is herein referred to as a first single crystalline semiconductor material. The at least one semiconductor material portion 2 can be semiconductor fins laterally spaced among one another by gaps, or can be active semiconductor regions electrically isolated by shallow trench isolation structures (not shown). The first single crystalline semiconductor material can be, for example, single crystalline silicon, single crystalline germanium, a single crystalline alloy of at least two of silicon, germanium, and carbon, a single crystalline compound semiconductor material, a polycrystalline elemental semiconductor material, a polycrystalline alloy of at least two of silicon, germanium, and carbon, a polycrystalline compound semiconductor material, or an amorphous semiconductor material. In one embodiment, the semiconductor material of the at least one semiconductor material portion 2 is single crystalline. In one embodiment, the at least one semiconductor material portion 2 can include a single crystalline silicon material, which can be intrinsic single crystalline silicon, p-doped single crystalline silicon, or n-doped single crystalline silicon.

The at least one semiconductor material portion 2 can be formed, for example, by providing a semiconductor-on-insulator (SOI) substrate including vertical stack of the handle substrate 108, the insulator layer 120 (which is a buried insulator layer), and a top semiconductor layer including the first single crystalline semiconductor material. The top semiconductor layer is patterned by a combination of lithographic methods and an anisotropic etch to form the at least one semiconductor material portion 2. The at least one semiconductor material portion 2 can be formed directly on the top surface of the insulator layer 120.

If the at least one semiconductor material portion 2 is a plurality of semiconductor fins, each of the at least one semiconductor material portion 2 can include a pair of vertical sidewalls that extend along a lengthwise direction the semiconductor material portion 101. As used herein, a "lengthwise direction" of an object is a direction along which the moment of inertia of the object becomes a minimum. The lengthwise direction of the at least one semiconductor material portion 2 can be a horizontal direction. In one embodiment, the at least one semiconductor material portion 2 can have a same horizontal lengthwise direction, i.e., the lengthwise directions of the at least one semiconductor material portion 2 can be parallel among each other and parallel to an interface between the insulator layer 120 and the at least one semiconductor material portion 2.

Referring to FIGS. 2A-2C, a diffusion-resistant dielectric material liner 22L and an etch stop layer 24L are formed on surfaces of the at least one semiconductor material portion 2. The diffusion-resistant dielectric material liner 22L includes a dielectric material that is diffusion-resistant to oxygen and moisture. As used herein, a material is diffusion-resistant if the material does not allow passage of gas species therethrough. In one embodiment, the diffusion-resistant dielectric material liner 22L includes a dielectric nitride. An exemplary dielectric nitride is silicon nitride. The diffusion-resistant dielectric material liner 22L can be deposited, for example, by chemical vapor deposition (CVD), atomic layer deposition (ALD), or a combination thereof. The thickness of the diffusion-resistant dielectric material liner 22L can be in a range from 2 nm to 10 nm, although lesser and greater thicknesses can also be employed.

The etch stop layer 24L can include a material that is different from a dielectric material of a dielectric gate structure to be subsequently formed. The etch stop layer 24L is employed as an etch stop structure during an anisotropic etch to be subsequently performed to remove the dielectric gate structure fully or partially. In one embodiment, the etch stop layer 24L includes a dielectric metal oxide. In one embodiment, the dielectric metal oxide can be an oxide of a transition metal or an oxide of a Lanthanide element. In one embodiment, the etch stop layer 24L can include a material selected from $HfO_2$, $ZrO_2$, $La_2O_3$, $Al_2O_3$, $TiO_2$, and $Y_2O_3$. In one embodiment, the etch stop layer 24L can be an $HfO_2$ layer. The etch stop layer 24L can have a dielectric constant greater than 8.0. The etch stop layer 24L can be deposited, for example, by atomic layer deposition (ALD). The thickness of the etch stop layer 24L can be in a range from 2 nm to 10 nm, although lesser and greater thicknesses can also be employed.

Referring to FIGS. 3A-3D, a dielectric material structure is formed over the at least one semiconductor material portion 2. The dielectric material structure defines an approximate extent of a gate electrode to be subsequently formed, and is herein referred to as a "dielectric gate structure" 38. The dielectric gate structure 38 includes a dielectric material that is different from the dielectric material of the etch stop layer 24L. In one embodiment, the dielectric gate structure 38 can include silicon nitride. The dielectric gate structure 38 can be formed, for example, by depositing a dielectric material layer over the etch stop layer 24, applying and patterning a photoresist layer over the dielectric material layer, and transferring the pattern in the photoresist layer into the dielectric material layer by an anisotropic etch. The photoresist layer can be subsequently removed, for example, by ashing. The sidewalls of the dielectric gate structure 38 are vertical.

Referring to FIGS. 4A-4C, portions of the etch stop layer 24L and the diffusion-resistant dielectric material liner 22L that are not covered by the dielectric gate structure 38 are physically removed by at least one etch process. The at least one etch process can include a wet etch process or a dry etch process. In some embodiments, a top surface and/or sidewall surfaces of the dielectric gate structure 39 may be collaterally etched during removal of physically exposed portions of the etch stop layer 24L and the diffusion-resistant dielectric material liner 22L. The removal of the physically exposed portions of the diffusion-resistant dielectric material liner 22L may be performed selective to the first single crystalline semiconductor material of the at least one semiconductor material portion 2.

A remaining portion of the diffusion-resistant dielectric material liner 22L underneath the dielectric gate structure 38 is herein referred to as a diffusion-resistant dielectric material portion 22, which is a dielectric material portion. A remaining portion of the etch stop layer 24L underneath the dielectric gate structure 38 is herein referred to as an etch stop portion 24.

Ion implantation of electrical dopants can be performed into the at least one semiconductor material portion 2 employing masked ion implantation or employing unmasked ion implantation. The dielectric gate structure 38 functions as a self-aligned implantation mask during the implantation process(es). The implanted portions of each semiconductor material portion 2 include a source region 2S and a drain region 2D. The unimplanted portions of each semiconductor fin 2 further includes a body region 2B, which laterally contacts a source region 2S and a drain region 2D.

Within each semiconductor material portion (2S, 2D, 2B), the source region 2S and the drain region 2D are formed within end portions of the semiconductor material portion (2S, 2D, 2B), and are laterally spaced from each other by a body region 2B underlying a dielectric gate structure 38.

Thus, each semiconductor material portion (2S, 2D, 2B) can include a source region 2S located at a first end portion of the s semiconductor material portion (2S, 2D, 2B), a drain region 2D located at a second end portion of the semiconductor material portion (2S, 2D, 2B) and is laterally spaced from the source region 2S, and a body region 2B laterally contacting the source region 2S and the drain region 2D and underlying the disposable gate structure 38.

Referring to FIGS. 5A-5D, a raised source region 6S and a raised drain region 6D are grown on physically exposed surfaces of the at least one semiconductor material portion 2. The raised source region 6S and a raised drain region 6D are herein collectively referred to as raised active semiconductor regions (6S, 6D). The raised source region 6S and the raised drain region 6D include a doped semiconductor material, which can be formed by deposition of a semiconductor material with in-situ doping, and/or deposition of a doped or undoped semiconductor material followed by ion implantation of electrical dopants, i.e., p-type dopants or n-type dopants.

In one embodiment, the raised source region 6S and a raised drain region 6D include a second single crystalline semiconductor material, and grow directly on semiconductor surfaces of the at least one semiconductor material portion 2. For example, the raised source region 6S can grow directly on the source region 2S, and the raised drain region 6D can grow directly on the drain region 2D.

In one embodiment, a selective epitaxy process can be employed to grow the raised source region 6S and a raised drain region 6D. During the selective epitaxy process, the first exemplary semiconductor structure including physically exposed surfaces of the at least one semiconductor material portion (2S, 3D, 3B) can be loaded into a process chamber, and at least one reactant precursor for the second single crystalline semiconductor material and an etchant are flowed into the process chamber. The flow rate of the at least one reactant precursor for the second single crystalline semiconductor material and the flow rate of the etchant can be time-invariant (i.e., constant as a function of time), or can be modulated as a function of time.

The flow rate of the at least one reactant precursor for the second single crystalline semiconductor material and the flow rate of the etchant are selected such that the deposition of the second single crystalline semiconductor material proceeds selectively, i.e., proceeds on semiconductor surfaces and does not proceed on dielectric surfaces. Specifically, the etch rate for any semiconductor material that may nucleate on dielectric surfaces is grater than the rate of growth of a seed semiconductor material for nucleation on the dielectric surfaces is etched immediately, and does not result in a sustainable mechanism. As such, the at least one reactant precursor does not nucleate on any dielectric surface during the selective epitaxy process.

The first single crystalline semiconductor material and the second single crystalline semiconductor material can have the same composition or different compositions. In one embodiment, the first single crystalline semiconductor material can be single crystalline silicon, and the second single crystalline semiconductor material can be a single crystalline silicon-germanium alloy. In this case, the second single crystalline semiconductor material can apply a tensile stress to the first single crystalline semiconductor material in the at least one semiconductor material portion (2S, 2D, 2B). In one embodiment, an atomic concentration of germanium in the second single crystalline semiconductor material can be in a range from 10% to 50%. In one embodiment, the first single crystalline semiconductor material can include silicon at an atomic concentration of at least 90%. In one embodiment, the first single crystalline semiconductor material can be doped or undoped silicon, or a doped or undoped silicon-germanium alloy in which the atomic concentration of silicon is at least 90%. In one embodiment, the first single crystalline semiconductor material can consist of silicon or consist of silicon and at least one electrical dopant.

In another embodiment, the first single crystalline semiconductor material can be a single crystalline silicon-germanium alloy, and the second single crystalline semiconductor material can be single crystalline silicon. In this case, the second single crystalline semiconductor material can apply a compressive stress to the first single crystalline semiconductor material in the at least one semiconductor material portion (2S, 2D, 2B). In one embodiment, an atomic concentration of germanium in the first single crystalline semiconductor material can be in a range from 10% to 50%. In one embodiment, the second single crystalline semiconductor material can include silicon at an atomic concentration of at least 90%. In one embodiment, the second single crystalline semiconductor material can be doped or undoped silicon, or a doped or undoped silicon-germanium alloy in which the atomic concentration of silicon is at least 90%. In one embodiment, the second single crystalline semiconductor material can consist of silicon or consist of silicon and at least one electrical dopant.

In yet another embodiment, the semiconductor composition of the first single crystalline semiconductor material can be the same as the semiconductor composition of the second single crystalline semiconductor material. As used herein, a "semiconductor composition" of a semiconductor material refers to a composition of the semiconductor material less all electrical dopants, i.e., p-type dopants or n-type dopants, within the semiconductor material. In other words, a semiconductor composition of a semiconductor material refers to the composition of an intrinsic equivalent of the semiconductor material. In one embodiment, the semiconductor composition of the first single crystalline semiconductor material and the semiconductor composition of the second single crystalline semiconductor material can consist of silicon, or can consist of silicon and carbon. In another embodiment, the semiconductor composition of the first single crystalline semiconductor material and the semiconductor composition of the second single crystalline semiconductor material can consist of silicon and germanium, or can consist of silicon, germanium, and carbon.

In still another embodiment, one or both of the first and second single crystalline semiconductor material can include a compound semiconductor material.

In one embodiment, the at least one reactant precursor can include at least one silicon-containing precursor and/or at least one germanium-containing precursor. For example, the at least one silicon-containing precursor can include at least one of $SiH_4$, $SiH_2Cl_2$, $SiHCl_3$, $SiCl_4$, and $Si_2H_6$. The at least one germanium-containing precursor can include at least one of $GeH_4$ and $Ge_2H_6$. The etchant can include HCl.

In one embodiment, an anneal at an elevated temperature can be optionally employed to interdiffuse semiconductor materials and/or electrical dopants across interfaces between the at least one semiconductor material portion (2S, 2D, 2B) and the raised source region 6S and a raised drain region 6D. The temperature of the anneal can be, for example, in a range from 800° C. to 1,100° C.

Referring to FIGS. 6A-6D, a planarization dielectric layer 90 is deposited over the raised source region 6S, the raised drain region 6D, and the dielectric gate structure 38. The planarization dielectric layer 90 includes a dielectric material such as silicon oxide. The planarization dielectric layer 90 can be deposited, for example, by chemical vapor deposition (CVD).

The planarization dielectric layer 90 is subsequently planarized, for example, by chemical mechanical planarization (CMP). The top surface of the planarization dielectric layer 90 can be coplanar with the top surface of the dielectric gate structure 38 after planarization. The planarization dielectric layer 90 can laterally surround, and embed, the dielectric gate structure 38, the at least one semiconductor material portion (2S, 2D, 2B), the raised source region 6S, and the raised drain region 6D.

Referring to FIGS. 7A-7D, the dielectric gate structure 38 is removed selective to the planarization dielectric layer 90 to form a gate cavity 59. The dielectric gate structure 38 is a disposable structure that can be completely removed at this processing step, and is herein referred to as a disposable dielectric gate structure 38. The removal of the dielectric gate structure 38 can be performed by a wet etch or a dry etch. The chemistry of the etch that removes the dielectric gate structure can be selective to the dielectric material of the etch stop portion 24. In one embodiment, the dielectric gate structure 38 can include silicon nitride, and the etch stop portion 24 can include a dielectric metal oxide, the planarization dielectric layer 90 can include silicon oxide, and the etch chemistry can employ hot phosphoric acid. The etch stop portion 24 can be subsequently removed by a dry etch or a wet etch that is selective to the diffusion-resistant dielectric material portion 22. A sidewall surface of the raised source region 6S and a sidewall surface of a raised drain region 6D are physically exposed within the gate cavity 59.

Figure 8C:
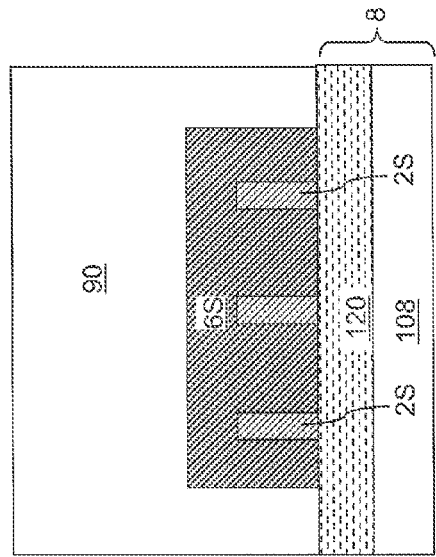
FIG. 8C is a vertical cross-sectional view of the first exemplary semiconductor structure along the plane C-C' of FIG. 8B.
Figure 8B:
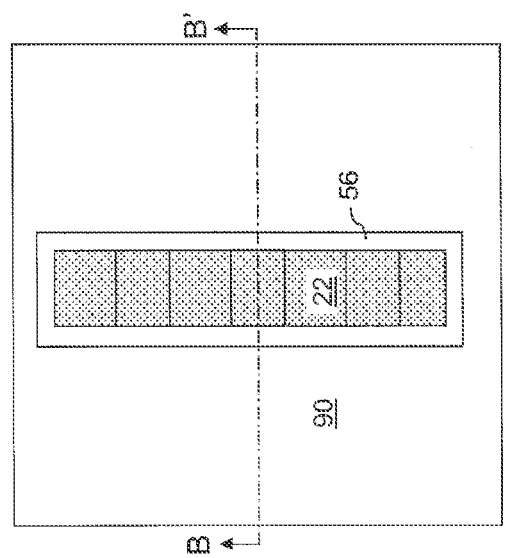
FIG. 8B is a vertical cross-sectional view of the first exemplary semiconductor structure along the plane B-B' of FIG. 8A.
Figure 8D:
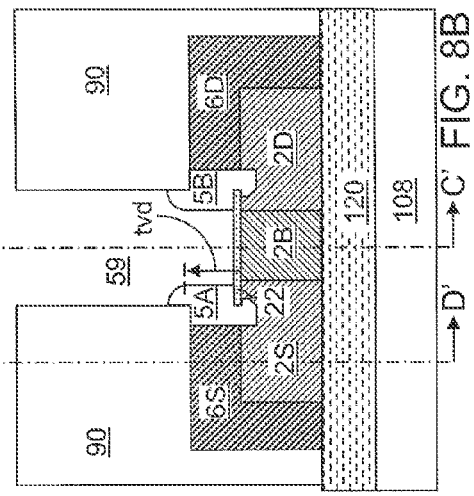
FIG. 8D is a vertical cross-sectional view of the first exemplary semiconductor structure along the plane D-D' of FIG. 8B.

Referring to FIGS. 8A-8D, surface portions of the raised source region 6S and the raised drain region 6D are converted into a dielectric material by a conversion process. The conversion process can be a thermal oxidation process, a thermal nitridation process, a thermal oxynitridation process, a plasma oxidation process, a plasma nitridation process, a plasma oxynitridation process, or a combination thereof. In one embodiment, the raised source region 6S and the raised drain region 6D include a doped semiconductor material, and the first and second dielectric spacers (5A, 5B) include a dielectric material that is an oxide, a nitride, or an oxynitride of the doped semiconductor material.

In an illustrative example, the conversion process can be a thermal oxidation process, and surface portions of the raised source region 6S and the raised drain region 6D are converted into dielectric semiconductor oxide portions. If the raised source region 6S and the raised drain region 6D include doped silicon, the dielectric semiconductor oxide portions can be a doped silicon oxide. The dopant in the doped silicon oxide can be a p-type dopant or an n-type dopant. The surface portion of the raised source region 6S is converted into a first dielectric material portion, which is herein referred to as a first dielectric spacer 5A. The surface portion of the raised drain region 6D is converted into a second dielectric material portion, which is herein referred to as a second dielectric spacer 5B.

The first dielectric spacer 5A and the second dielectric spacer 5B are two distinct structures that do not contact each other. The first dielectric spacer 5A and the second dielectric spacer 5B can have the same composition and the same lateral thickness. Inner sidewalls of the first and second dielectric spacers (5A, 5B) can be vertical at a lower portion, and can have convex surfaces at an upper portion. Thus, the lateral distance between the first and second dielectric spacers (5A, 5B) is uniform up to a threshold vertical distance tvd from the body region 2B, and increases with a vertical distance from the body region 2B if the vertical distance exceeds the threshold vertical distance tvd.

In one embodiment the diffusion-resistant dielectric material portion 22 can protect at least a portion, or the entirety, of the body region 2B in each semiconductor material portion (2S, 2D, 2B) from conversion into a dielectric material during the conversion of the surface portions of the raised source region 6S and the raised drain region 6D. For example, if the diffusion-resistant dielectric material portion 22 includes silicon nitride and thermal oxidation is employed to form the first and second dielectric spacers (5A, 5B), the diffusion-resistant dielectric material portion 22 can block diffusion of oxygen into the at least one body region 2B, and prevent conversion of the at least one body region 2B into semiconductor oxide portions. In one embodiment, a top portion of the source region 2S and a top portion of a drain region may be converted into a semiconductor oxide material, and may be incorporated into the first and second dielectric spacers (5A, 5B), respectively.

Referring to FIGS. 9A-9D, physically exposed portions of the diffusion-resistant dielectric material portion 22 can be removed, for example, by an etch selective to the semiconductor material of the at least one body region 2B. The etch can be an isotropic etch such as a wet etch or an isotropic dry etch. If a portion of the diffusion-resistant dielectric material portion 22 is present after the etch, the remaining portion of the diffusion-resistant dielectric material portion 22 can constitute a pair of dielectric material portions 22' that are laterally spaced from each other by the replacement gate stack (50, 52).

A replacement gate structure is formed within the gate cavity 59. For example, a gate dielectric layer and a gate conductor layer may be deposited in the gate cavity 59 and over the planarization dielectric layer 90, and the portions of the gate dielectric layer and the gate conductor layer may be removed from above the top surface of the planarization dielectric layer 90 by a planarization process. The planarization process can employ a recess etch, chemical mechanical planarization (CMP), or a combination thereof. A remaining portion of the gate dielectric layer within the gate cavity 59 constitutes a gate dielectric 50, and a remaining portion of the gate conductor layer within the gate cavity 59 constitutes a gate electrode 52.

The gate dielectric layer, and consequently, the gate dielectric 50, can include a dielectric material, which can be silicon oxide, silicon nitride, silicon oxynitride, or a stack thereof. Alternately or additionally, the gate dielectric layer, and consequently, the gate dielectric 50, can include a high dielectric constant (high-k) material layer having a dielectric constant greater than 3.9. In one embodiment, the gate dielectric layer can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric 50 can be from 0.9 nm to 6 nm, although lesser and greater thicknesses can also be employed.

The gate conductor layer can be a single layer or a plurality of layers. In one embodiment, the gate conductor layer can include a stack of a workfunction metal layer and a conductive material layer. The workfunction material layer can include a material that optimizes the threshold voltage of a field effect transistor including the replacement gate structure. The conductive material layer can include a metallic material or a doped semiconductor material. The doped semiconductor material, if present, can be doped polysilicon, doped polycrystalline germanium, a doped silicon-germanium alloy, any other doped elemental or compound semiconductor material, or a combination thereof. The metallic material, if present, can be any metallic material that can be deposited by chemical vapor deposition (CVD), physical vapor deposition (PVD), or a combination thereof. For example, the metallic material can include aluminum and/or tungsten. The thickness of the gate conductor layer can be from 20 nm to 200 nm, although lesser and greater thicknesses can also be employed. The gate electrode 52 can include a remaining portion of the workfunction material layer and a remaining portion of the conductive material layer after the planarization process.

The stack of the gate dielectric 50 and the gate electrode 52 is herein referred to as a gate stack (50, 52). The gate stack (50, 52) straddles the body region 2B of the at least one semiconductor material portion (2S, 2D, 2B). The top surface of the planarization dielectric layer 90 is coplanar with the topmost surface of the gate stack (50, 52). Topmost surfaces of the first and second dielectric spacers (5A, 5B) are located underneath the horizontal plane including the topmost surface of the gate stack (50, 52).

The first dielectric spacer 5A contacts a first vertical sidewall of the gate dielectric 50, and the second dielectric spacer 5B contacts a second vertical sidewall of the gate dielectric 50 and is laterally spaced from the first dielectric spacer 5A by the gate stack (50, 52).

The gate electrode 52 includes a middle portion having a variable horizontal cross-sectional area that increases with a vertical distance from the at least one body region 5B. The gate electrode further includes a lower portion that underlies the middle portion and having a first constant horizontal cross-sectional area that is invariant with the vertical distance from the at least one body region 2B. The boundary between the middle portion and the lower portion can be at the plane of the threshold vertical distance tvd (See FIG. 8B). An upper portion of the gate electrode 52 overlies the middle portion and has a second constant horizontal cross-sectional area that is greater than the first constant horizontal cross-sectional area and is invariant with the vertical distance from the at least one body region 2B.

A portion of a first vertical sidewall G1 of the gate dielectric 50 is located between a first parallel pair of vertical planes (S11, S12) including sidewalls of the first dielectric spacer 5A, and a portion of a second vertical sidewall G2 of the gate dielectric 50 is located between a second parallel pair of vertical planes (S21, S22) including sidewalls of the second dielectric spacer 5B. The first dielectric spacer 5A contacts another portion of the first vertical sidewall G1 of the gate dielectric 50, and the second dielectric spacer 5B contacts another portion of the second vertical sidewall G2 of the gate dielectric 50, and is laterally spaced from the first dielectric spacer 5A by the gate stack (50, 52).

Figure 10A:
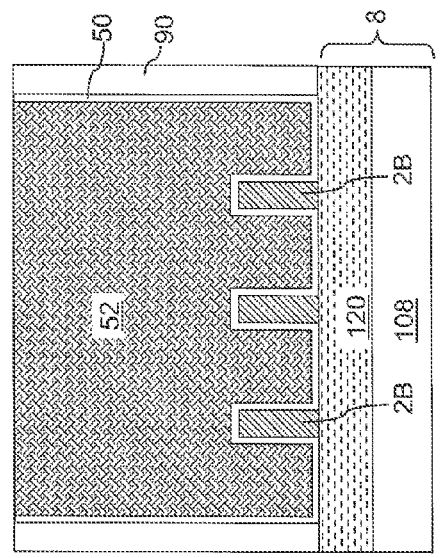
FIG. 10A is a top-down view of a variation of the first exemplary semiconductor structure after formation of a replacement gate structure according to the first embodiment of the present disclosure.
Figure 10C:
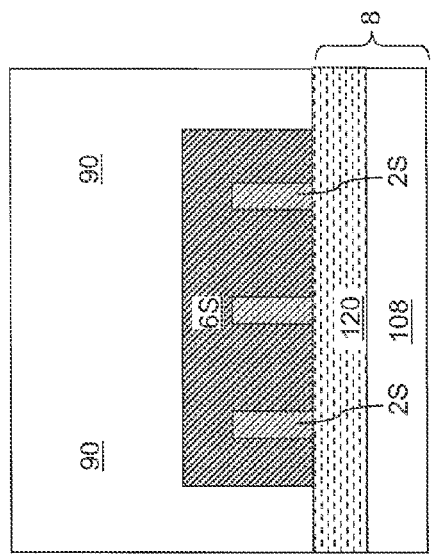
FIG. 10C is a vertical cross-sectional view of the first exemplary semiconductor structure along the plane C-C' of FIG. 10B.
Figure 10B:
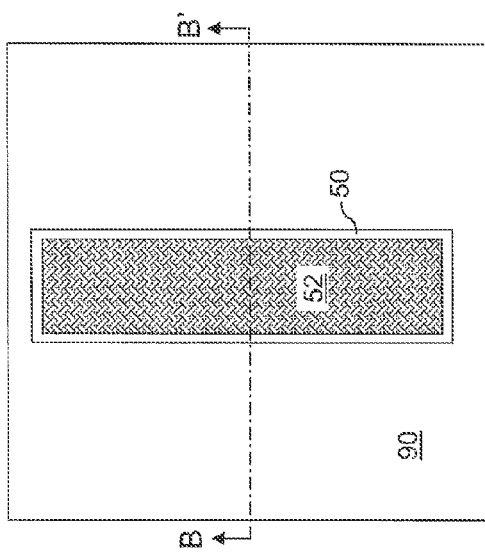
FIG. 10B is a vertical cross-sectional view of the first exemplary semiconductor structure along the plane B-B' of FIG. 10A.
Figure 10D:
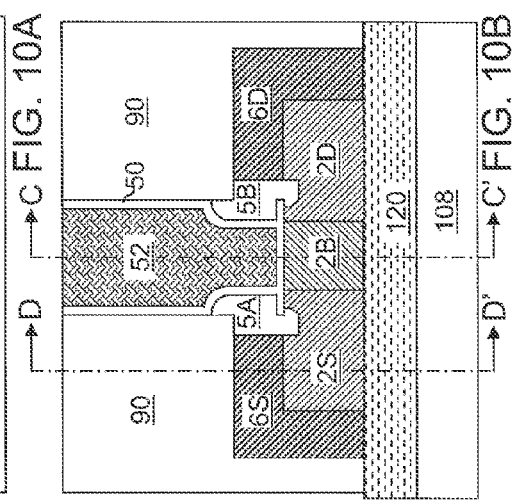
FIG. 10D is a vertical cross-sectional view of the first exemplary semiconductor structure along the plane D-D' of FIG. 10B.

Referring to FIGS. 10A-10D, a variation of the first exemplary semiconductor structure is derived from the first exemplary semiconductor structure of FIGS. 8A-8D by completely removing the diffusion-resistant dielectric material portion 22 prior to forming the replacement gate structure employing the processing steps of FIGS. 9A-9D.

Referring to FIGS. 11A-11D, a second exemplary semiconductor structure according to a second embodiment of the present disclosure is derived from the first exemplary semiconductor structure of FIGS. 6A-6B by recessing the top surface of the planarization dielectric layer 90 relative to the top surface of the dielectric gate structure 38, which is a disposable dielectric gate structure. The recessing of the top surface of the planarization dielectric layer 90 can be performed selective to the dielectric gate structure 38 by an etch, which can be a wet etch or a dry etch. In an illustrative example, if the dielectric gate structure 38 includes silicon nitride and if the planarization dielectric layer 90 includes silicon oxide, a wet etch employing hydrofluoric acid can be employed to recess the top surface of the planarization dielectric layer 90.

Referring to FIGS. 12A-12D, a semiconductor material layer 60 is deposited over the planarization dielectric layer 90, and is subsequently planarized employing the dielectric gate structure 38 as a stopping structure. The top surface the semiconductor material layer 60 can be coplanar with the top surface of the dielectric gate structure 38. The semiconductor material layer 60 includes a semiconductor material, which can be silicon, a silicon-germanium alloy, a silicon-carbon alloy, a silicon-germanium-carbon alloy, a compound semiconductor material, or any other semiconductor material that can be converted into a dielectric material by oxidation, nitridation, or a combination thereof. The thickness of the semiconductor material layer 60 after planarization can be in a range from 10 nm to 100 nm, although lesser and greater thicknesses can also be employed. The semiconductor material layer 60 includes an opening therein. The periphery of the opening coincides with the sidewalls of the dielectric gate structure 38.

Referring to FIGS. 13A-13D, the dielectric gate structure 38 is removed selective to the planarization dielectric layer 90 and the semiconductor material layer 60 to form a gate cavity 59. The dielectric gate structure 38 is a disposable structure that can be completely removed at this processing step. The removal of the dielectric gate structure 38 can be performed by a wet etch or a dry etch. The chemistry of the etch that removes the dielectric gate structure can be selective to the dielectric material of the etch stop portion 24. In one embodiment, the dielectric gate structure 38 can include silicon nitride, and the etch stop portion 24 can include a dielectric metal oxide, the planarization dielectric layer 90 can include silicon oxide, and the etch chemistry can employ hot phosphoric acid. The etch stop portion 24 can be subsequently removed by a dry etch or a wet etch that is selective to the diffusion-resistant dielectric material portion 22. A sidewall surface of the raised source region 6S and a sidewall surface of a raised drain region 6D are physically exposed within the gate cavity 59.

Referring to FIGS. 14A and 14B, physically exposed vertical sidewalls of the planarization dielectric layer 90 can be laterally recessed to provide lateral expansion of the gate cavity. In one embodiment, an isotropic etch may be employed to laterally recess the physically exposed vertical sidewalls of the planarization dielectric layer 90. In an illustrative example, if the planarization dielectric layer 90 includes silicon oxide, a wet etch employing hydrofluoric acid may be employed to isotropically etch surface portions of the planarization dielectric layer 90. The lateral distance by which the vertical sidewalls of the planarization dielectric layer 90 are recessed may be in a range from 1 nm to 50 nm, although lesser and greater lateral distances can also be employed.

Referring to FIGS. 15A-15D, surface portions of the raised source region 6S and the raised drain region 6D are converted into a dielectric material by a conversion process. The conversion process can be a thermal oxidation process, a thermal nitridation process, a thermal oxynitridation process, a plasma oxidation process, a plasma nitridation process, a plasma oxynitridation process, or a combination thereof. In one embodiment, the raised source region 6S and the raised drain region 6D include a doped semiconductor material, and the first and second dielectric spacers (5A, 5B) include a dielectric material that is an oxide, a nitride, or an oxynitride of the doped semiconductor material.

In an illustrative example, the conversion process can be a thermal oxidation process, and surface portions of the raised source region 6S and the raised drain region 6D are converted into dielectric semiconductor oxide portions. If the raised source region 6S and the raised drain region 6D include doped silicon, the dielectric semiconductor oxide portions can be a doped silicon oxide. The dopant in the doped silicon oxide can be a p-type dopant or an n-type dopant. The surface portion of the raised source region 6S is converted into a first dielectric material portion, which is herein referred to as a first dielectric spacer 5A. The surface portion of the raised drain region 6D is converted into a second dielectric material portion, which is herein referred to as a second dielectric spacer 5B.

The first dielectric spacer 5A and the second dielectric spacer 5B are two distinct structures that do not contact each other. The first dielectric spacer 5A and the second dielectric spacer 5B can have the same composition and the same lateral thickness. Inner sidewalls of the first and second dielectric spacers (5A, 5B) can be vertical at a lower portion, and can have convex surfaces at an upper portion. Thus, the lateral distance between the first and second dielectric spacers (5A, 5B) is uniform up to a threshold vertical distance tvd from the body region 2B, and increases with a vertical distance from the body region 2B if the vertical distance exceeds the threshold vertical distance tvd.

Simultaneously with the conversion of surface portions of the raised source region 6A and the raised drain region 6B, the semiconductor material layer 60 is converted into a semiconductor-element-including dielectric material layer 66. The semiconductor-element-including dielectric material layer 66 includes the atoms of the semiconductor material layer 60 and oxygen and/or nitrogen. The semiconductor-element-including dielectric material layer 66 includes a dielectric material that is an oxide, a nitride, or an oxynitride of the semiconductor material of the semiconductor material layer 60.

The semiconductor-element-including dielectric material layer 60 overlies the planarization dielectric layer 90, and includes overhanging portions that overlie peripheral portions of the gate cavity 59. The semiconductor-element-including dielectric material layer 60 overlies the first dielectric spacer 5A and the second dielectric spacer 5B. In one embodiment, if the first and second dielectric spacers (5A, 5B) include a doped semiconductor oxide formed by oxidation, the semiconductor-element-including dielectric material layer 60 includes a semiconductor oxide material, which can be doped or undoped.

In one embodiment the diffusion-resistant dielectric material portion 22 can protect at least a portion, or the entirety, of the body region 2B in each semiconductor material portion (2S, 2D, 2B) from conversion into a dielectric material during the conversion of the surface portions of the raised source region 6S and the raised drain region 6D. For example, if the diffusion-resistant dielectric material portion 22 includes silicon nitride and thermal oxidation is employed to form the first and second dielectric spacers (5A, 5B), the diffusion-resistant dielectric material portion 22 can block diffusion of oxygen into the at least one body region 2B, and prevent conversion of the at least one body region 2B into semiconductor oxide portions. In one embodiment, a top portion of the source region 2S and a top portion of a drain region may be converted into a semiconductor oxide material, and may be incorporated into the first and second dielectric spacers (5A, 5B), respectively.

Referring to FIGS. 16A-16D, a conformal dielectric material layer is deposited in the gate cavity 59 and over the planarization dielectric layer, and is anisotropically etched to remove horizontal portions. In one embodiment, an anisotropic etch process employed to anisotropically etch the conformal dielectric material layer can be selective to the semiconductor material of the at least one body region 2B. Remaining vertical portions of the conformal dielectric material layer 58 forms a contiguous dielectric structure that laterally surrounds a remaining portion of the gate cavity 59, and is herein referred to as a contiguous dielectric spacer 58. The contiguous dielectric spacer 58 can be topologically homeomorphic to a torus. As used herein, an element is "topologically homeomorphic" to a shape if the element can be continuously stretched without forming or eliminating a hole into the shape. The contiguous dielectric spacer 58 overlies the first dielectric spacer 5A and the second dielectric spacer 5B. The planarization dielectric layer 90 laterally surrounds the contiguous dielectric layer 58.

The conformal dielectric material layer, and consequently, the contiguous dielectric spacer 58, includes a dielectric material, which can be different from the dielectric material of the semiconductor-element-including dielectric material layer 60. In one embodiment, the contiguous dielectric spacer can include silicon oxide. In one embodiment, the semiconductor-element-including dielectric material layer 66 can be employed as an etch mask during the anisotropic etch. In this case, peripheral surfaces of the opening in the semiconductor-element-including dielectric material layer 66 can be vertically coincident with inner vertical sidewalls of the contiguous dielectric spacer 58. As used herein, a first surface is vertically coincident with a second surface if there exists a vertical plane from which the first surface and the second surface deviates less than the sum of the surface roughness of the first surface and the surface roughness of the second surface. In one embodiment, the inner sidewall surfaces of the first and second dielectric spacers (5A, 5B) may be vertically coincident with the inner vertical sidewalls of the contiguous dielectric spacer 58.

Referring to FIGS. 17A-17D, physically exposed portions of the diffusion-resistant dielectric material portion 22 can be removed, for example, by an etch selective to the semiconductor material of the at least one body region 2B. The etch can be an isotropic etch such as a wet etch or an isotropic dry etch. If a portion of the diffusion-resistant dielectric material portion 22 is present after the etch, the remaining portion of the diffusion-resistant dielectric material portion 22 can constitute a ring-shaped dielectric material portion 22", which is topologically homeomorphic to a torus and having a same thickness throughout.

A replacement gate structure is formed within the gate cavity 59. For example, a gate dielectric layer and a gate conductor layer may be deposited in the gate cavity 59 and over the planarization dielectric layer 90, and the portions of the gate dielectric layer and the gate conductor layer may be removed from above the top surface of the planarization dielectric layer 90 by a planarization process. The planarization process can employ a recess etch, chemical mechanical planarization (CMP), or a combination thereof. A remaining portion of the gate dielectric layer within the gate cavity 59 constitutes a gate dielectric 50, and a remaining portion of the gate conductor layer within the gate cavity 59 constitutes a gate electrode 52. The same processing steps can be employed as in the first embodiment.

The stack of the gate dielectric 50 and the gate electrode 52 is herein referred to as a gate stack (50, 52). The gate stack (50, 52) straddles the body region 2B of the at least one semiconductor material portion (2S, 2D, 2B). The top surface of the planarization dielectric layer 90 is coplanar with the topmost surface of the gate stack (50, 52). Topmost surfaces of the first and second dielectric spacers (5A, 5B) are located underneath the horizontal plane including the topmost surface of the gate stack (50, 52).

The first dielectric spacer 5A contacts a first vertical sidewall of the gate dielectric 50, and the second dielectric spacer 5B contacts a second vertical sidewall of the gate dielectric 50 and is laterally spaced from the first dielectric spacer 5A by the gate stack (50, 52). Sidewall of the gate dielectric 50 vertically extend from a body region 2B to a horizontal plane including the top surface of the semiconductor-element-including dielectric material layer 66.

The gate dielectric 50 can include a horizontal portion that contacts a body region 2B and vertical portions that extend from the body region 2B to the horizontal plane including the top surface of the semiconductor-element-including dielectric material layer 66. The gate electrode 52 can have the same horizontal cross-sectional area throughout.

Referring to FIGS. 18A-18D, a third exemplary semiconductor structure according to a third embodiment of the present disclosure can be derived from the second exemplary semiconductor structure of FIGS. 11A-11D. The dielectric gate structure 38 is etched isotropically by an isotropic etch. After the isotropic etch, a top surface of the dielectric gate structure 38 protrudes above a recessed top surface of the planarization dielectric layer 90 (which is recessed at the processing steps of FIGS. 11A-11D), and peripheral surfaces of the dielectric gate structure 38 adjoin sidewalls of the planarization dielectric layer 90. The locations at which the peripheral surfaces of the dielectric gate structure 38 adjoin sidewalls of the planarization dielectric layer 90 are more proximal to the horizontal plane including the top surface(s) of the at least one body region 2B than the recessed top surface of the planarization dielectric layer 90. Peripheral top surfaces of the dielectric gate structure 38 are concave surfaces, and contiguously extend around the protruding portion of the dielectric ate structure 38.

Referring to FIGS. 19A-19D, a dielectric material layer 166 is formed over the planarization dielectric layer 90. The dielectric material layer 166 may be formed in a self-planarizing manner, or may be formed in a non-self-planarizing manner and subsequently planarized to provide a planar top surface. The dielectric material layer 166 as planarized includes an opening therein such that the periphery of the opening coincides with sidewall surfaces of the protruding portion of the dielectric gate structure 38. The periphery of the opening is within the area defined by sidewalls of the dielectric gate structures 38 that contact the vertical sidewalls of the planarization dielectric layer 90. In other words, the periphery of the opening in the dielectric material layer 166 is laterally offset inward from the interfaces between the dielectric gate structure 38 and the planarization dielectric layer 90.

In one embodiment, the dielectric material layer 166 includes a self-planarizing dielectric material such as spin-on-glass (SOG), which becomes a silicon oxide material upon curing. The top surface of the dielectric material layer 166 can be coplanar with, or can be located below the horizontal plane including, the top surface of the protruding portion of the dielectric gate structure 38.

In another embodiment, the dielectric material layer 166 can be formed by deposition of a dielectric material such as silicon oxide or a dielectric metal oxide, and subsequent planarization employing the top surface of the protruding portion of the dielectric gate structure 38 as a stopping structure. In this case, the top surface of the dielectric material layer 166 can be coplanar with the top surface of the protruding portion of the dielectric gate structure 38.

The dielectric material layer 166 having the opening therein is formed directly on the recessed surface of the planarization dielectric layer 90, and directly on upper portions of the sidewalls of the planarization dielectric layer 90. The dielectric material layer 166 includes vertically downward-protruding portions, which protrude below a horizontal interface between the dielectric material layer and the planarization dielectric layer 90. A contiguous outer periphery of vertically downward-protruding portions of the dielectric material layer 166 contacts sidewalls of the planarization dielectric layer 90.

Referring to FIGS. 20A-20D, a dielectric spacer and a gate cavity 59 are formed by anisotropically etching the dielectric gate structure 38 employing the dielectric material layer 166 as an etch mask. A remaining contiguous portion of the dielectric gate structure 38 constitutes a dielectric spacer, which is herein referred to as a contiguous dielectric spacer 57.

Specifically, the dielectric gate structure 38 is anisotropically etched to remove portions that do not underlie the dielectric material layer 66. The dielectric material layer 66 is employed as an etch mask during the anisotropic etch process. The anisotropic etch process removes the dielectric material of the dielectric gate structure 38 to form a gate cavity 59. The remaining portion of the dielectric gate structure 38 constitutes a contiguous dielectric spacer 57, which include vertical portions of the dielectric gate structure 38 that are protected from the anisotropic etch by the dielectric material layer 166. The contiguous dielectric spacer 57 is topologically homeomorphic to a torus. Each concave surface of the contiguous dielectric spacer 57 contacts a convex surface of the dielectric material layer 166. Peripheral surfaces of the opening in the dielectric material layer 166 can be vertically coincident with inner vertical sidewalls of the contiguous dielectric spacer 57.

In one embodiment, the anisotropic etch process can be selective to the dielectric material of the etch stop portion 24. After the gate cavity 59 extends to the top surface of the etch stop portion 24, physically exposed regions of the etch stop portion 24 can be removed by an etch, which can be a wet etch or a dry etch. The remaining portion of the etch stop portion 24 that underlies the contiguous gate spacer 57 is herein referred to as a ring-shaped etch stop portion 24". The ring-shaped etch stop portion 24" has the same thickness throughout, and is topologically homeomorphic to a torus.

After the physically exposed regions of the etch stop portion 24 is removed, physically exposed regions of the diffusion-resistant dielectric material portion 22 can be removed by an etch, which can be a wet etch or a dry etch.

The remaining portion of the diffusion-resistant dielectric material portion 22 that underlies the ring-shaped etch stop portion 24" is herein referred to as a ring-shaped dielectric material portion 22", which is topologically homeomorphic to a torus and having a same thickness throughout.

In one embodiment, formation of the diffusion-resistant dielectric material portion 22L (See FIGS. 2A-2C) can be optionally omitted, in which case the ring-shaped etch stop portion 24" contacts the top surface of the at least one body region 2B.

Referring to FIGS. 21A-21D, a replacement gate structure is formed within the gate cavity 59. For example, a gate dielectric layer and a gate conductor layer may be deposited in the gate cavity 59 and over the dielectric material layer 166, and the portions of the gate dielectric layer and the gate conductor layer may be removed from above the top surface of the dielectric material layer 166 (or from above the top surface of the planarization dielectric layer 90) by a planarization process. The planarization process can employ a recess etch, chemical mechanical planarization (CMP), or a combination thereof. A remaining portion of the gate dielectric layer within the gate cavity 59 constitutes a gate dielectric 50, and a remaining portion of the gate conductor layer within the gate cavity 59 constitutes a gate electrode 52. The same processing steps can be employed as in the first embodiment.

The stack of the gate dielectric 50 and the gate electrode 52 is herein referred to as a gate stack (50, 52). The gate stack (50, 52) straddles the body region 2B of the at least one semiconductor material portion (2S, 2D, 2B). The top surface of the dielectric material layer 166 can be coplanar with the topmost surface of the gate stack (50, 52).

The gate dielectric 50 can include a horizontal portion that contacts a body region 2B and vertical portions that extend from the body region 2B to the horizontal plane including the top surface of the dielectric material layer 166. The gate electrode 52 can have the same horizontal cross-sectional area throughout.

The planarization dielectric layer 90 laterally surrounds the contiguous dielectric spacer 57 and underlies the dielectric material layer 166. The contiguous dielectric spacer 57 laterally surrounds the gate stack (50, 52). All sidewalls of the contiguous dielectric spacer 57 can be within vertical planes. The dielectric material layer 166 overlies the contiguous dielectric spacer 57, and includes an opening therein. The periphery of the opening is vertically coincident with vertical interfaces between the gate stack (50, 52) and the contiguous dielectric spacer 57. In one embodiment, the contiguous outer periphery of the downward-protruding portions of the dielectric material layer 166 can be vertically coincident with outer sidewalls of the contiguous dielectric spacer 57.

The various methods of the present disclosure minimize a collateral etch of a gate spacer, thereby enabling precise control of lateral dimensions of a replacement gate structure, and enhancing the reliability of replacement field effect transistors. The various methods of the present disclosure can be applied to fin field effect transistors having a predominant portion of channels underneath vertical interface with a gate dielectric and to planar field effect transistor having a predominant portion of channels underneath at least one horizontal interface with a gate dielectric.

While the present disclosure has been particularly shown and described with respect to preferred embodiments thereof, it will be understood by those skilled in the art that the foregoing and other changes in forms and details may be made without departing from the spirit and scope of the present disclosure. Each of the various embodiments of the present disclosure can be implemented alone, or in combination with any other embodiments of the present disclosure unless expressly disclosed otherwise or otherwise impossible as would be known to one of ordinary skill in the art. It is therefore intended that the present disclosure not be limited to the exact forms and details described and illustrated, but fall within the scope of the appended claims.

What is claimed is:

1. A method of forming a semiconductor structure comprising:
    forming a disposable dielectric gate structure over a semiconductor material portion;
    forming a source region, a drain region, and a body region in said semiconductor material portion;
    forming a raised source region and a raised drain region on said source region and said drain region, respectively, wherein said raised source region and said raised drain region contact sidewalls of said disposable dielectric gate structure;
    forming a planarization dielectric layer over said raised source region and said raised drain region and around said disposable dielectric gate structure;
    removing said disposable dielectric gate structure selective to said planarization dielectric layer to form a gate cavity; and
    converting surface portions of said raised source region and said raised drain region into a first dielectric spacer and a second dielectric spacer.

2. The method of claim 1, wherein said converting of said surface portions of said raised source region and said raised drain region is performed employing a thermal oxidation process, a thermal nitridation process, a thermal oxynitridation process, a plasma oxidation process, a plasma nitridation process, a plasma oxynitridation process, or a combination thereof.

3. The method of claim 1, further comprising:
    forming a diffusion-resistant dielectric material liner on said semiconductor material portion, wherein said disposable dielectric gate structure is formed over said diffusion-resistant dielectric material liner;
    patterning said diffusion-resistant dielectric material liner into a dielectric material portion, wherein said dielectric material portion protects a portion of said body region from conversion into a dielectric material during said converting of said surface portions of said raised source region and said raised drain region.

4. The method of claim 1, further comprising forming a replacement gate structure including a gate dielectric and a gate electrode within said gate cavity.

5. The method of claim 1, further comprising:
    recessing a top surface of said planarization dielectric layer relative to a top surface of said disposable dielectric gate structure;
    forming a semiconductor material layer over said planarization dielectric layer; and
    converting said semiconductor material layer into a semiconductor-element-including dielectric material layer simultaneously with said converting of said surface portions of said raised source region and said raised drain region.

6. The method of claim 5, further comprising:
    depositing a conformal dielectric material layer in said gate cavity after said converting of said surface portions of said raised source region and said raised drain region; and forming an additional dielectric spacer by anisotropically etching said conformal dielectric material layer employing said semiconductor-element-including dielectric material layer as an etch mask.

7. The method of claim 1, wherein said semiconductor material portion is a semiconductor fin.

8. The method of claim 1, wherein said semiconductor material portion has a bottommost surface that is located directly on a topmost surface of an insulator layer.

9. The method of claim 1, wherein said forming said raised source region and said raised drain region comprises deposition of a semiconductor material with in-situ doping.

10. The method of claim 9, wherein said deposition is a selective epitaxy process.

11. The method of claim 1, wherein said first dielectric spacer and said second dielectric spacer are distinct structures that do not contact each other.

12. The method of claim 11, wherein said first dielectric spacer and said second dielectric spacer have an inner sidewall that is vertical at a lower portion, and a convex surface at an upper portion.

13. A method of forming a semiconductor structure comprising:
    forming a dielectric gate structure over a semiconductor material portion;
    forming a source region, a drain region, and a body region in said semiconductor material portion;
    forming a raised source region and a raised drain region on said source region and said drain region, respectively, wherein said raised source region and said raised drain region contact sidewalls of said dielectric gate structure;
    forming a planarization dielectric layer over said raised source region and said raised drain region and around said dielectric gate structure;
    recessing said planarization dielectric layer below a top surface of said dielectric gate structure;
    etching said dielectric gate structure isotropically, wherein a top surface of said dielectric gate structure protrudes above a recessed surface of said planarization dielectric layer and peripheral surfaces of said dielectric gate structure adjoin sidewalls of said planarization dielectric layer below said recessed surface of said planarization dielectric layer after said etching of said dielectric gate structure;
    forming a dielectric material layer having an opening therein over said recessed planarization dielectric layer, wherein a periphery of said opening is within an area defined by sidewalls of said dielectric gate structures; and
    forming a dielectric spacer and a gate cavity by anisotropically etching said dielectric gate structure employing said dielectric material layer as an etch mask, wherein a remaining contiguous portion of said dielectric gate structure constitutes said dielectric spacer.

14. The method of claim 13, further comprising forming a replacement gate structure including a gate dielectric and a gate electrode within said gate cavity.

15. The method of claim 13, wherein said dielectric material layer having said opening therein is formed directly on a recessed surface of said planarization dielectric layer and directly on portions of said sidewalls of said planarization dielectric layer.

16. The method of claim 13, wherein said semiconductor material portion is a semiconductor fin.

17. The method of claim 13, wherein said semiconductor material portion has a bottommost surface that is located directly on a topmost surface of an insulator layer.

18. The method of claim 13, wherein said forming said raised source region and said raised drain region comprises deposition of a semiconductor material with in-situ doping.

19. The method of claim 18, wherein said deposition is a selective epitaxy process.

* * * * *